US010522775B2

(12) United States Patent
Tsukamoto et al.

(10) Patent No.: US 10,522,775 B2
(45) Date of Patent: Dec. 31, 2019

(54) EL DISPLAY DEVICE INCLUDING ISLAND SHAPED HOLE INJECTION LAYER AND ISLAND SHAPED ELECTRON INJECTION LAYER AND METHOD OF MANUFACTURING THE SAME

(71) Applicant: Sharp Kabushiki Kaisha, Sakai, Osaka (JP)

(72) Inventors: Yuto Tsukamoto, Sakai (JP); Shinichi Kawato, Sakai (JP); Manabu Niboshi, Sakai (JP); Satoshi Inoue, Sakai (JP); Hiroshi Imada, Sakai (JP); Tokiyoshi Umeda, Sakai (JP); Bai Zhang, Sakai (JP); Tomoaki Jo, Sakai (JP)

(73) Assignee: SHARP KABUSHIKI KAISHA, Sakai (JP)

(*) Notice: Subject to any disclaimer, the term of this patent is extended or adjusted under 35 U.S.C. 154(b) by 19 days.

(21) Appl. No.: 16/067,258

(22) PCT Filed: Mar. 30, 2017

(86) PCT No.: PCT/JP2017/013367
§ 371 (c)(1),
(2) Date: Jun. 29, 2018

(87) PCT Pub. No.: WO2018/179272
PCT Pub. Date: Oct. 4, 2018

(65) Prior Publication Data
US 2019/0363272 A1 Nov. 28, 2019

(51) Int. Cl.
*H01L 51/50* (2006.01)
*H01L 51/00* (2006.01)
(Continued)

(52) U.S. Cl.
CPC .......... *H01L 51/5012* (2013.01); *H01L 27/32* (2013.01); *H01L 51/0011* (2013.01);
(Continued)

(58) Field of Classification Search
CPC .................. H01L 51/5088; H01L 51/5092
See application file for complete search history.

(56) References Cited

U.S. PATENT DOCUMENTS

2003/0227253 A1   12/2003  Seo et al.
2006/0220535 A1*  10/2006  Nakayama .......... H01L 51/5092
                                                        313/504
(Continued)

FOREIGN PATENT DOCUMENTS

JP    2006-261611 A    9/2006
JP    2012-69876 A     4/2012
(Continued)

OTHER PUBLICATIONS

Official Communication issued in International Patent Application No. PCT/JP2017/013367, dated Jun. 6, 2017.

*Primary Examiner* — Daniel Whalen
(74) *Attorney, Agent, or Firm* — Keating & Bennett, LLP

(57) ABSTRACT

A hole injection layer provided between a first electrode and each of light emitting layers, and an electron injection layer provided between a second electrode and each of light emitting layers, overlap only inward from an end portions each of the light emitting layers when viewed in plan view.

18 Claims, 15 Drawing Sheets

(51) Int. Cl.
*H01L 27/32* (2006.01)
*H01L 51/56* (2006.01)

(52) U.S. Cl.
CPC ...... *H01L 51/5088* (2013.01); *H01L 51/5092* (2013.01); *H01L 51/56* (2013.01)

(56) References Cited

U.S. PATENT DOCUMENTS

| | | | |
|---|---|---|---|
| 2013/0134403 A1 | 5/2013 | Harada et al. | |
| 2013/0285042 A1* | 10/2013 | Komatsu | H01L 27/3279 257/40 |
| 2014/0291647 A1 | 10/2014 | Suzuki et al. | |
| 2017/0012231 A1* | 1/2017 | Mishima | H01L 51/5004 |

FOREIGN PATENT DOCUMENTS

| | | |
|---|---|---|
| JP | 2013-41850 A | 2/2013 |
| JP | 2014-209607 A | 11/2014 |
| JP | 2015-207527 A | 11/2015 |
| JP | 2017-22369 A | 1/2017 |
| WO | 2012/017503 A1 | 2/2012 |
| WO | 2013/089138 A1 | 6/2013 |

* cited by examiner 108R  108R  108R  108R  108R  108R 108R  108G  108B  108R  108G  108B

EL DISPLAY DEVICE INCLUDING ISLAND SHAPED HOLE INJECTION LAYER AND ISLAND SHAPED ELECTRON INJECTION LAYER AND METHOD OF MANUFACTURING THE SAME

TECHNICAL FIELD

The disclosure relates to an EL display device including organic EL elements, and to a method of manufacturing an EL display device including organic EL elements.

BACKGROUND ART

In recent years, various types of flat panel displays have been developed. With their ability to achieve reduced power consumption, thinner profiles, and higher picture quality, organic Electro luminescence (EL) display devices in particular are attracting attention as excellent flat panel displays.

When manufacturing an organic EL display device, a method is typically used in which a constant gap between a vapor deposition mask and an active matrix substrate is ensured by providing an edge cover (also called a "bank material" or a "partition material") having a constant height on the active matrix substrate, and a vapor deposition film is then formed using the vapor deposition mask.

PTL 1 and 2 disclose organic EL display devices configured including such an edge cover on the active matrix substrate.

FIG. 14A is a diagram illustrating the overall configuration of a known organic EL display device 101 including an edge cover 112 having openings 112a, and FIG. 14B is a diagram illustrating a problem with the known organic EL display device 101 including the edge cover 112.

As illustrated in FIG. 14A, the organic EL display device 101 includes a substrate 102, active elements 103 (e.g. TFT elements) formed on one face of the substrate 102, an insulating layer 104 covering the active elements 103, first electrodes 105 (e.g. ITO) electrically connected to the active elements 103 with contact holes formed in the insulating layer 104 therebetween, and the edge cover 112 formed covering the insulating layer 104 exposed between end portions of adjacent first electrodes 105 and the end portions of the first electrodes 105.

In the organic EL display device 101, a hole injection layer (HIL layer) 106 and a hole transport layer (HTL layer) 107 are furthermore formed above the substrate 102 covering the first electrodes 105 and the edge cover 112.

A red light emitting layer (EML layer) 108R, a green light emitting layer (EML layer) 108G, and a blue light emitting layer (EML layer; not illustrated) are formed on the hole injection layer 106 and the hole transport layer 107 above the regions where the first electrodes 105 are formed.

An electron transport layer (ETL layer) 109 and an electron injection layer (EIL layer) 110 are formed above the substrate 102 covering the hole transport layer 107, the red light emitting layer 108R, the green light emitting layer 108G, and the blue light emitting layer (not illustrated). A second electrode 111 (e.g. a metal layer) is formed above the substrate 102 covering the electron injection layer 110.

FIG. 15 is a diagram illustrating a process of manufacturing the known organic EL display device 101 illustrated in FIG. 14A.

In the organic EL display device 101, the hole injection layer 106 is formed above the substrate 102, covering the first electrodes 105 and the edge cover 112, using an open mask (S101).

The hole transport layer 107 is then formed above the substrate 102, covering the hole injection layer 106, using an open mask (S102).

Then, the red light emitting layer 108R, the green light emitting layer 108G, and the blue light emitting layer (not illustrated) are formed on the hole injection layer 106 and the hole transport layer 107 above the regions where the first electrodes 105 are formed, using three coloring masks (S103).

The electron transport layer 109 is then formed above the substrate 102, covering the hole transport layer 107, the red light emitting layer 108R, the green light emitting layer 108G, and the blue light emitting layer (not illustrated), using an open mask (S104).

After this, the electron injection layer 110 is formed above the substrate 102, covering the electron transport layer 109, using an open mask (S105).

Finally, the second electrode 111 is formed above the substrate 102, covering the electron injection layer 110, using an open mask (S106).

The organic EL display device 101 including red light-emitting organic EL elements, green light-emitting organic EL elements, and blue light-emitting organic EL elements can be realized through this procedure.

In recent years, highly electrically conductive P-doped hole injection layers, highly electrically conductive P-doped high-polymer hole injection layers, and the like are more commonly being used as the hole injection layer 106. Additionally, there is a trend toward using a shape having a sharp taper angle for the edge cover 112 in order to increase the resolution.

CITATION LIST

Patent Literature

PTL 1: WO 2012/017503 (published internationally Feb. 9, 2012)

PTL 2: JP 2015-207527 A (published Nov. 19, 2015)

SUMMARY

Technical Problem

FIG. 14B is a diagram illustrating a problem with the known organic EL display device 101 including the hole injection layer 106, which is a highly electrically conductive P-doped hole injection layer or a highly electrically conductive P-doped high-polymer hole injection layer, and the edge cover 112, which is shaped having a sharp taper angle.

As illustrated in FIG. 14B, in the known organic EL display device 101 employing the edge cover 112 having a sharp taper angle and the highly electrically conductive hole injection layer 106, the edge cover 112 having a sharp taper angle is employed. Thus, when forming a layered body in which the highly electrically conductive hole injection layer 106, the hole transport layer 107, the light emitting layers (the red light emitting layer 108R, the green light emitting layer 108G, and the blue light emitting layer (not illustrated)), the electron transport layer 109, the electron injection layer 110, and the second electrode 111 serving as a reflective electrode are layered in that order, the film thickness distribution changes drastically near the edge cover 112 in the layered body due to the shape of the edge cover 112, which has sharp angled surfaces. This results in the formation of extremely thin parts.

The organic EL display device 101 includes the highly electrically conductive hole injection layer 106, and thus crosstalk is produced by horizontal current in the highly electrically conductive hole injection layer 106 (current in an in-plane direction), as indicated by the dotted-line arrows in FIG. 14B. There is thus a problem in that each in the red light-emitting organic EL elements each including the red light emitting layer 108R, the green light-emitting organic EL elements each including the green light emitting layer 108G, and the blue light-emitting organic EL elements each including the blue light emitting layer (not illustrated), this crosstalk results in a peripheral area emitting intense light, while a central area has reduced light emitting efficiency.

Having been conceived of in light of the foregoing problem, an object of the disclosure is to provide an EL display device, and a method of manufacturing an EL display device, that suppresses intense light emission in a peripheral area of EL element while improving the light emitting efficiency in a central area of the EL element, even in an EL display device employing an edge cover (also called a "bank material" or "partition material") having a sharp taper angle for increased resolution.

Solution to Problem

To solve the above-described problems, an EL display device according to the disclosure includes a first electrode, a second electrode opposing the first electrode, light emitting layers each formed having an island shape, between the first electrode and the second electrode, a hole injection layer provided between the first electrode and each of the light emitting layers, and an electron injection layer provided between the second electrode and each of the light emitting layers. The hole injection layer and the electron injection layer overlap only inward from an end portion each of the light emitting layers, when viewed in plan view.

According to the above-described configuration, the hole injection layer and the electron injection layer overlap only inward from the end portion each of the light emitting layers, and thus light is emitted only at a part inward from the end portion each of the light emitting layers. Accordingly, even in a case where the organic EL display device employs an edge cover having a sharp taper angle to increase the resolution, it is possible to achieve an organic EL display device that suppresses intense light emission at the end portion each of the light emitting layers and improves the light emitting efficiency at the part inward from the end portion each of the light emitting layers.

To solve the above-described problems, a method of manufacturing an EL display device is a method of manufacturing an EL display device including a first electrode, a second electrode opposing the first electrode, and light emitting layers each formed having an island shape, between the first electrode and the second electrode, the method includes forming a hole injection layer between the first electrode and each of the light emitting layers, and forming an electron injection layer between the second electrode and each of the light emitting layers. The hole injection layer formed in the forming a hole injection layer and the electron injection layer formed in the forming an electron injection layer overlap only inward from an end portion each of the light emitting layers, when viewed in plan view.

According to the above-described method, the hole injection layer and the electron injection layer overlap only inward from the end portion each of the light emitting layers, and thus light is emitted only at a part inward from the end portion each of the light emitting layers. Accordingly, even in a case where the organic EL display device employs an edge cover having a sharp taper angle to increase the resolution, it is possible to achieve a method of manufacturing an organic EL display device that suppresses intense light emission at the end portion each of the light emitting layers and improves the light emitting efficiency at the part inward from the end portion each of the light emitting layers.

Advantageous Effects of Disclosure

According to aspects of the disclosure, it is possible to provide an EL display device, and a method of manufacturing an EL display device, that suppresses intense light emission in a peripheral area each of organic EL elements while improving the light emitting efficiency in a central area each of the organic EL elements, even in an EL display device employing an edge cover having a sharp taper angle for increased resolution.

DESCRIPTION OF EMBODIMENTS

Embodiments of the disclosure will be described hereinafter on the basis of FIGS. 1A to 13B. For explanatory purposes, configurations having the same functions as configurations described in individual embodiments may be given the same reference signs, and descriptions thereof may be omitted.

Although an organic EL display device is described as an example of an EL display device in the following embodiments, the device is not limited thereto, and the type of device is not particularly limited as long as it is an EL display device having a plurality of deposition layers.

First Embodiment

A first embodiment of the disclosure will be described on the basis of FIGS. 1A to 3B.

Figure 1A:
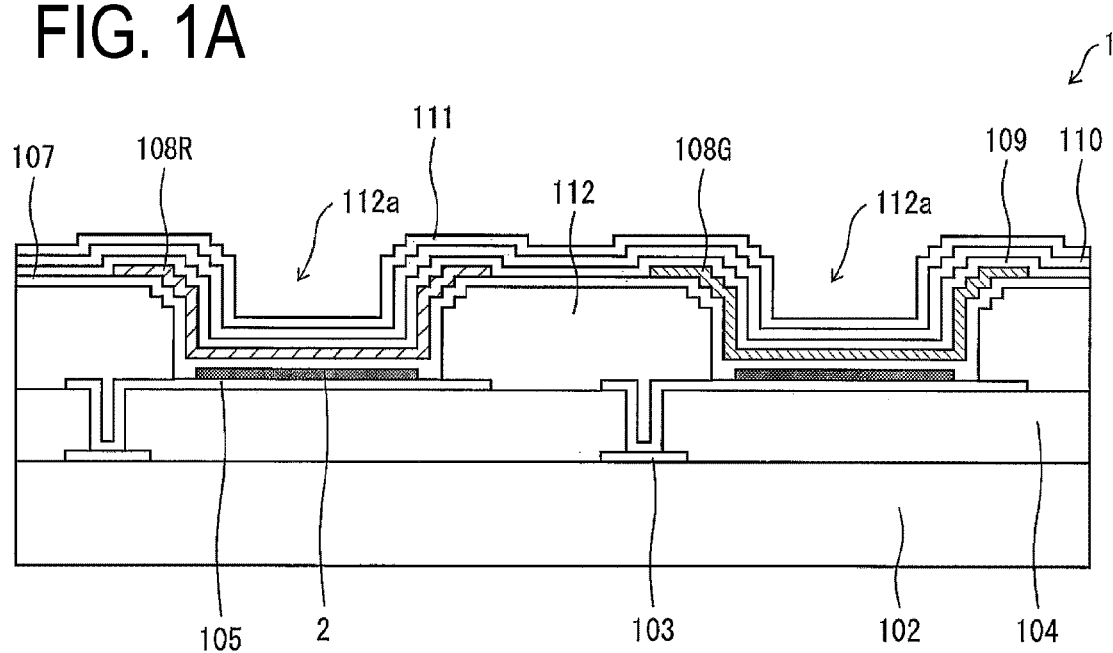
FIG. 1A is a diagram illustrating the overall configuration of an organic EL display device employing an edge cover having a sharp taper angle.
Figure 1B:
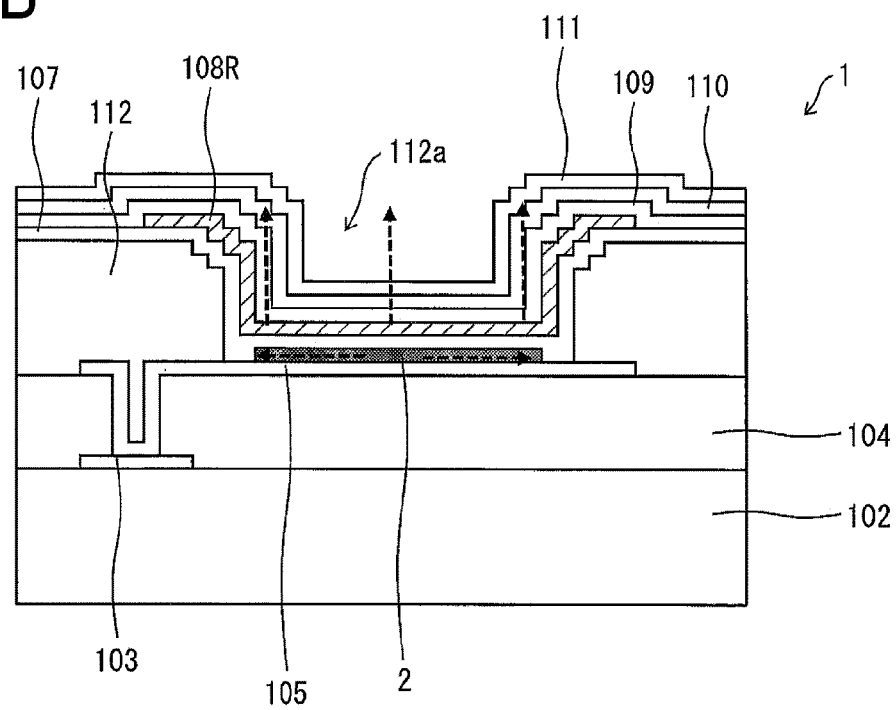
FIG. 1B is a diagram illustrating a reason why, in the organic EL display device, intense light emission can be suppressed in a peripheral area each of organic EL elements while the light emitting efficiency can be improved in a central area each of the organic EL elements.

FIG. 1A is a diagram illustrating the overall configuration of an organic EL display device 1 employing an edge cover 112 having a sharp taper angle, and FIG. 1B is a diagram illustrating a reason why, in the organic EL display device 1, intense light emission can be suppressed in a peripheral area each of organic EL elements while the light emitting efficiency can be improved in a central area each of the organic EL elements.

As illustrated in FIG. 1A, the organic EL display device 1 includes a substrate 102, active elements 103 (e.g. TFT elements) formed on one face of the substrate 102, an insulating layer 104 covering the active elements 103, a first electrode 105 (e.g. ITO) electrically connected to each of the active elements 103 by means of a corresponding contact hole formed in the insulating layer 104 therebetween, and the edge cover 112 formed covering the insulating layer 104, which is exposed between end portions of adjacent first electrodes 105, and the end portions of the adjacent first electrodes 105.

Furthermore, the organic EL display device 1 includes a hole injection layer (HIL layer) 2 formed above the substrate 102 and a hole transport layer (HTL layer) 107 formed above the substrate 102 covering the first electrodes 105, the hole injection layer 2, and the edge cover 112.

A red light emitting layer (EML layer) 108R, formed having an island shape, is formed on the hole injection layer 2 and the hole transport layer 107 above a region where the first electrode 105 is formed. A green light emitting layer (EML layer) 108G, formed having an island shape, is formed on the hole injection layer 2 and the hole transport layer 107 above a region where the first electrode 105 is formed. A blue light emitting layer (EML layer; not illustrated), formed having an island shape, is formed on the hole injection layer 2 and the hole transport layer 107 above a region where the first electrode 105 is formed.

An electron transport layer (ETL layer) 109 and an electron injection layer (EIL layer) 110 are formed above the substrate 102 covering the hole transport layer 107, the red light emitting layer 108R, the green light emitting layer 108G, and the blue light emitting layer (not illustrated). A second electrode 111 (e.g. a metal layer) is formed above the substrate 102 covering the electron injection layer 110.

The edge cover 112 having a sharp taper angle is provided covering a peripheral of the first electrode 105.

Organic EL elements configured to emit light of the corresponding color are formed in the organic EL display device 1 by layering the island-shaped highly electrically conductive hole injection layer 2, the hole transport layer 107, any one of the light emitting layer among the island-shaped red light emitting layer 108R, the island-shaped green light emitting layer 108G, and the island-shaped blue light emitting layer (not illustrated), the electron transport layer 109, the electron injection layer 110, and the second electrode 111 (e.g. a metal layer) serving as a reflective electrode, in that order.

In the case where the organic EL element is a red light-emitting organic EL element, the element may include the red light emitting layer 108R as a light emitting layer; in the case where the organic EL element is a green light-emitting organic EL element, the element may include the green light emitting layer 108G as a light emitting layer; and in the case where the organic EL element is a blue light-emitting organic EL element, the element may include the blue light emitting layer as a light emitting layer.

Although the present embodiment describes a case where the electron transport layer 109 and the electron injection layer 110 are included as separate layers as an example, the layers are not limited to this configuration. The electron transport layer 109 and the electron injection layer 110 may be formed as a single layer functioning as both the electron injection layer and the electron transport layer.

An electron blocking layer may be provided between the hole transport layer 107 and the red light emitting layer 108R, between the hole transport layer 107 and the green light emitting layer 108G, and between the hole transport layer 107 and the blue light emitting layer (not illustrated). A hole blocking layer may be provided between the red light emitting layer 108R and the electron transport layer 109, between the green light emitting layer 108G and the electron transport layer 109, and between the blue light emitting layer (not illustrated) and the electron transport layer 109.

As illustrated in FIG. 1A, in the organic EL display device 1, the edge cover 112 having a sharp taper angle is employed. Thus, when forming a layered body in which the hole injection layer 2, the hole transport layer 107, any one of the light emitting layer among the red light emitting layer 108R, the green light emitting layer 108G, and the blue light emitting layer (not illustrated), the electron transport layer 109, the electron injection layer 110, and the second electrode 111 serving as a reflective electrode are layered in that order, the film thickness distribution changes drastically near the edge cover 112 in the layered body due to the edge cover 112 having a sharp taper angle. This results in the formation of an extremely thin part. For this reason, the peripheral area each of the organic EL elements configured to emit light of the corresponding color is the above-described extremely thin part in the layered body.

Thus, as illustrated in FIG. 1A, the organic EL display device 1 includes the hole injection layer 2 and the electron injection layer 110, when viewed in plan view, formed overlapping only inward from an end portion each of the island-shaped red light emitting layer 108R, the island-shaped green light emitting layer 108G, and the island-shaped blue light emitting layer (not illustrated).

In the present embodiment, the electron injection layer 110 is formed covering the entireties of the island-shaped red light emitting layer 108R, the island-shaped green light emitting layer 108G, and the island-shaped blue light emitting layer (not illustrated). The hole injection layer 2 is divided into a plurality of parts isolated from each other in an island shape, and each of the isolated and island-shaped parts of the hole injection layer 2 is smaller than each of the island-shaped red light emitting layer 108R, the island-shaped green light emitting layer 108G, and the island-shaped blue light emitting layer (not illustrated).

Note that in the present embodiment, it is preferable that the part of the hole injection layer 2 and the electron injection layer 110 that overlap when viewed in plan view overlaps, when viewed in plan view, with an opening 112a in the edge cover 112 formed covering the end portions of the adjacent first electrodes 105 which, of the first electrode 105 and the second electrode 111, are in a lower layer.

As illustrated in FIG. 1A, the hole injection layer 2 is not formed in the extremely thin part of the layered body, which is the peripheral area each of the organic EL elements included in the organic EL display device 1. As such, a problem in which crosstalk (current in an in-plane direction) arising in each of the organic EL elements due to horizontal current in the highly electrically conductive hole injection layer 2 results in the peripheral area each of the organic EL elements emitting intense light while the central area each of the organic EL elements has reduced light emitting efficiency can be suppressed.

In other words, as illustrated in FIG. 1B, in the organic EL elements included in the organic EL display device 1, the horizontal current in the highly electrically conductive hole injection layer 2 arises only inward from the end portion each of the island-shaped red light emitting layer 108R, the island-shaped green light emitting layer 108G, and the island-shaped blue light emitting layer (not illustrated), as indicated by the arrows in FIG. 1B. When viewed in plan view, the hole injection layer 2 and the electron injection layer 110 overlap only inward from the end portion each of the island-shaped red light emitting layer 108R, the island-shaped green light emitting layer 108G, and the island-shaped blue light emitting layer (not illustrated), and thus light is emitted from the part inward from the end portion each of the red light emitting layer 108R, the green light emitting layer 108G, and the blue light emitting layer (not illustrated). Accordingly, even in a case where the organic EL display device 1 employs the edge cover 112 having a sharp taper angle to increase the resolution, it is possible to achieve an organic EL display device 1 that suppresses intense light emission at the end portion each of the red light emitting layer 108R, the green light emitting layer 108G, and the blue light emitting layer (not illustrated) and improves the light emitting efficiency at the part inward from the end portion each of the red light emitting layer 108R, the green light emitting layer 108G, and the blue light emitting layer (not illustrated).

Figure 2:
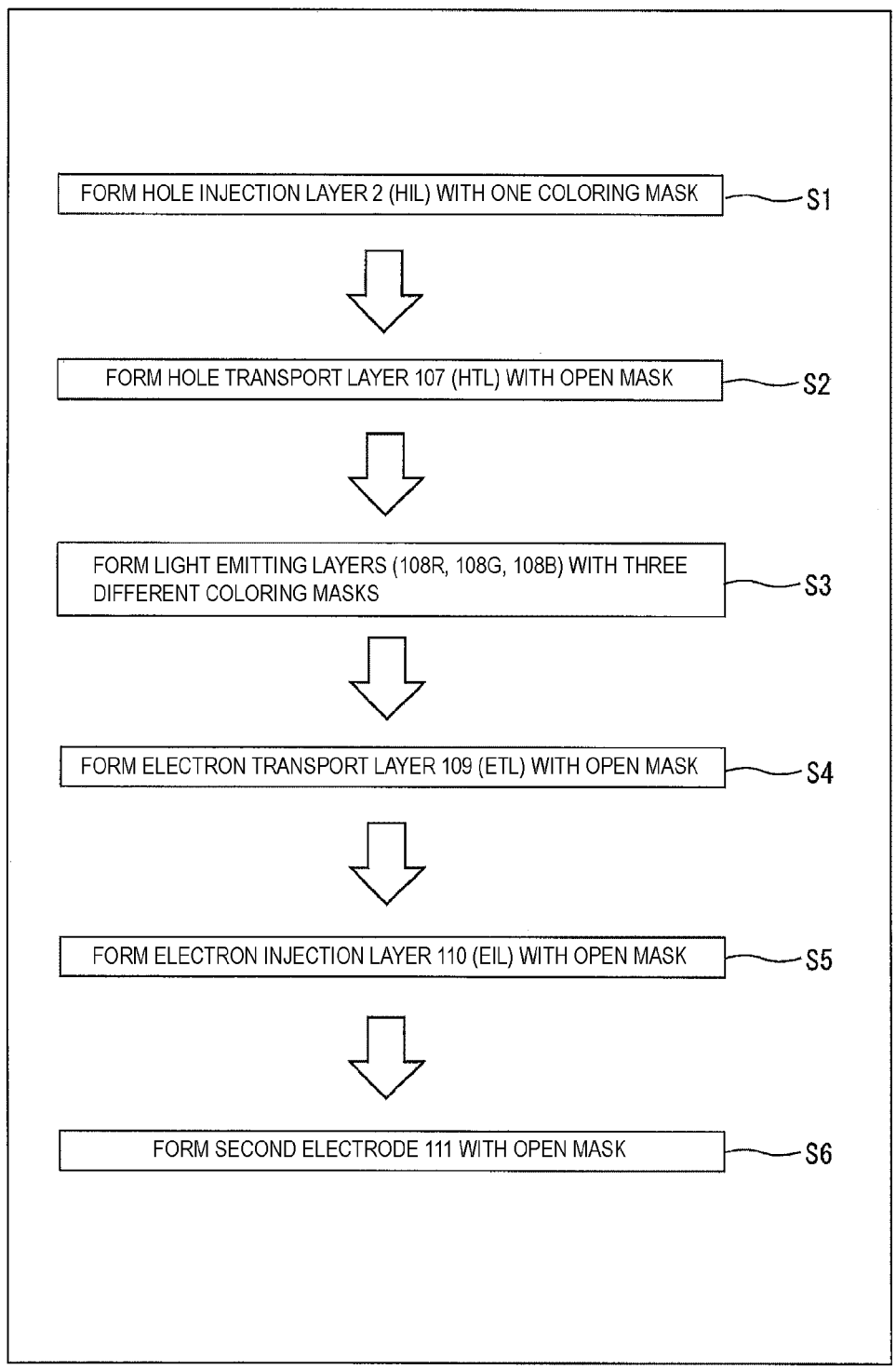
FIG. 2 is a diagram illustrating a process of manufacturing the organic EL display device illustrated in FIGS. 1A and 1B.

FIG. 2 is a diagram illustrating a process of manufacturing the organic EL display device 1 illustrated in FIGS. 1A and 1B.

Figure 3A:
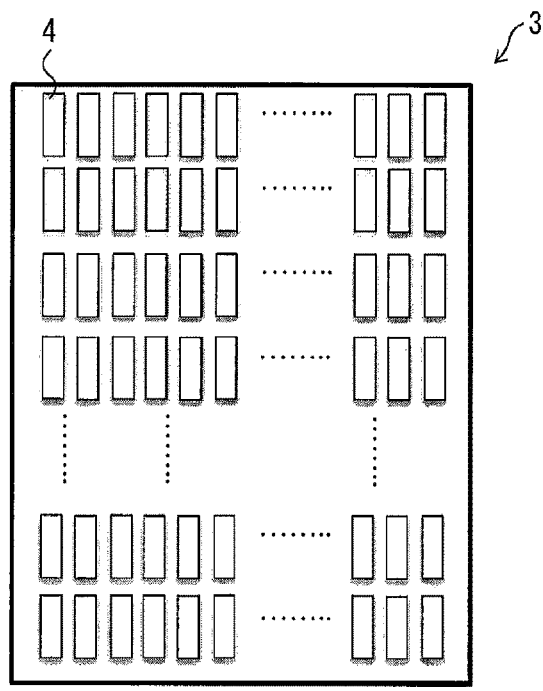
FIG. 3A is a diagram illustrating an example of a coloring mask having a plurality of openings used in a process of forming a hole injection layer.
Figure 3B:
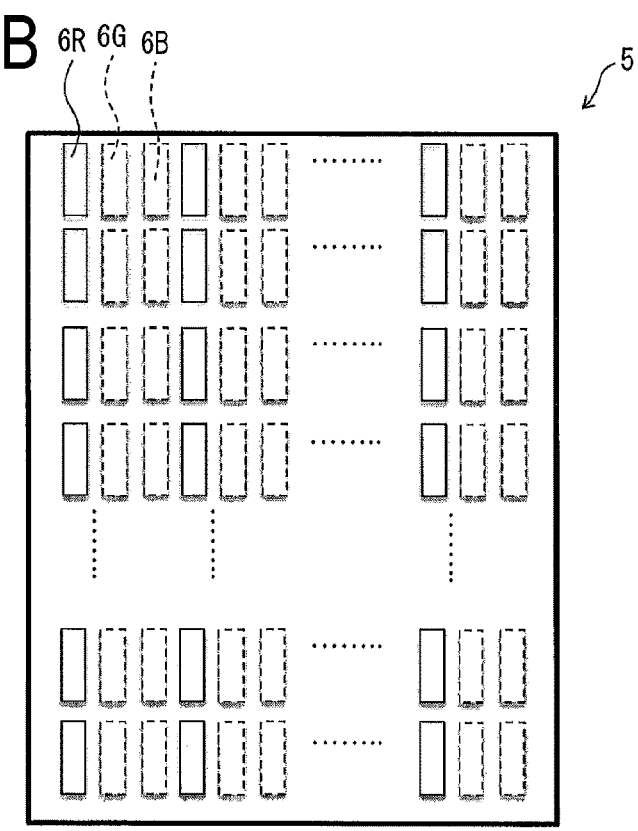
FIG. 3B is a diagram illustrating an example of a coloring mask having a plurality of openings used in a process of forming each of a red light emitting layer, a green light emitting layer, and a blue light emitting layer (not illustrated).

FIG. 3A is a diagram illustrating an example of a coloring mask (first mask) 3 having a plurality of openings 4 and used in a process for forming the hole injection layer 2, and FIG. 3B is a diagram illustrating an example of a coloring mask 5 having openings 6R, 6G, or 6B and used in a process for forming the red light emitting layer 108R, the green light emitting layer 108G, or the blue light emitting layer (not illustrated), respectively.

As illustrated in FIG. 2, in the organic EL display device 1, the hole injection layer 2 is formed above the substrate 102, divided into a plurality of parts isolated from each other in an island shape using the coloring mask 3 having a plurality of openings 4 as illustrated in FIG. 3A while covering the first electrode 105 and the edge cover 112 (S1).

The hole transport layer 107 is then formed above the substrate 102, covering the hole injection layer 2, using an open mask having a single opening (S2).

Then, the red light emitting layer 108R, the green light emitting layer 108G, and the blue light emitting layer (not illustrated) are formed on the corresponding hole injection layer 2 and the hole transport layer 107 above the region where the corresponding first electrode 105 is formed, using three coloring masks, including the coloring mask 5 having a plurality of openings 6R and used in the process of forming the red light emitting layer 108R, illustrated in FIG. 3B (S3).

The electron transport layer 109 is then formed above the substrate 102, covering the hole transport layer 107, the red light emitting layer 108R, the green light emitting layer 108G, and the blue light emitting layer (not illustrated), using an open mask having a single opening (S4).

After this, the electron injection layer 110 is formed above the substrate 102, covering the electron transport layer 109, using an open mask (a second mask) having a single opening (S5).

Finally, the second electrode 111 is formed above the substrate 102, covering the electron injection layer 110, using an open mask having a single opening (S6).

Although the present embodiment describes a case where the first electrode 105 are in a lower layer than the second electrode 111, the first electrode 105 is transparent electrode capable of transmitting light at the wavelength at which the corresponding light emitting layer emits the light, and the second electrode 111 is a reflective electrode as an example, the configuration is not limited thereto, and the first electrode 105 may be in a higher layer than the second electrode 111.

Second Embodiment

Next, a second embodiment of the disclosure will be described on the basis of FIGS. 4A to 5. An organic EL display device 10 according to the present embodiment differs from that of the first embodiment in that: the hole injection layer 106 is formed overlapping the entireties of the red light emitting layer 108R, the green light emitting layer 108G, and the blue light emitting layer (not illustrated) when viewed in plan view; an electron injection layer 11 is divided into a plurality of parts isolated from each other in an island shape, and each of the isolated and island-shaped parts of the electron injection layer 11 is each smaller than the red light emitting layer 108R, the green light emitting layer 108G, and the blue light emitting layer (not illustrated), respectively. Aside from these points, the organic EL display device 10 according to the present embodiment is the same as described in the first embodiment. For the sake of simplicity, members having the same functions as the members illustrated in the drawings referenced in the first embodiment will be given the same reference signs, and descriptions thereof will be omitted.

Figure 4A:
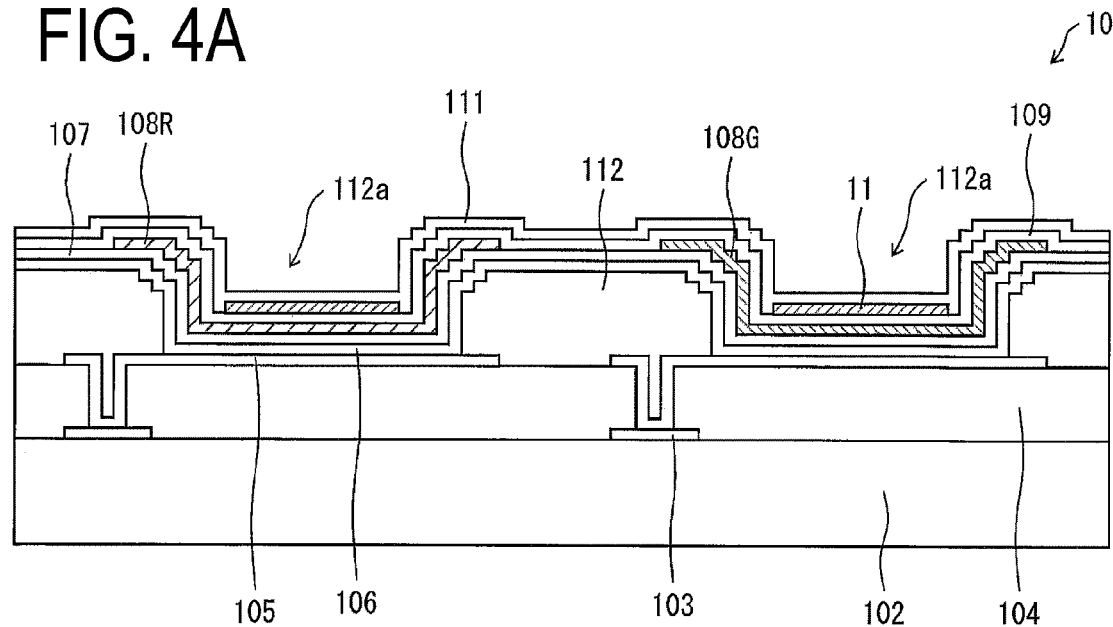
FIG. 4A is a diagram illustrating the overall configuration of an organic EL display device employing an edge cover having a sharp taper angle.
Figure 4B:
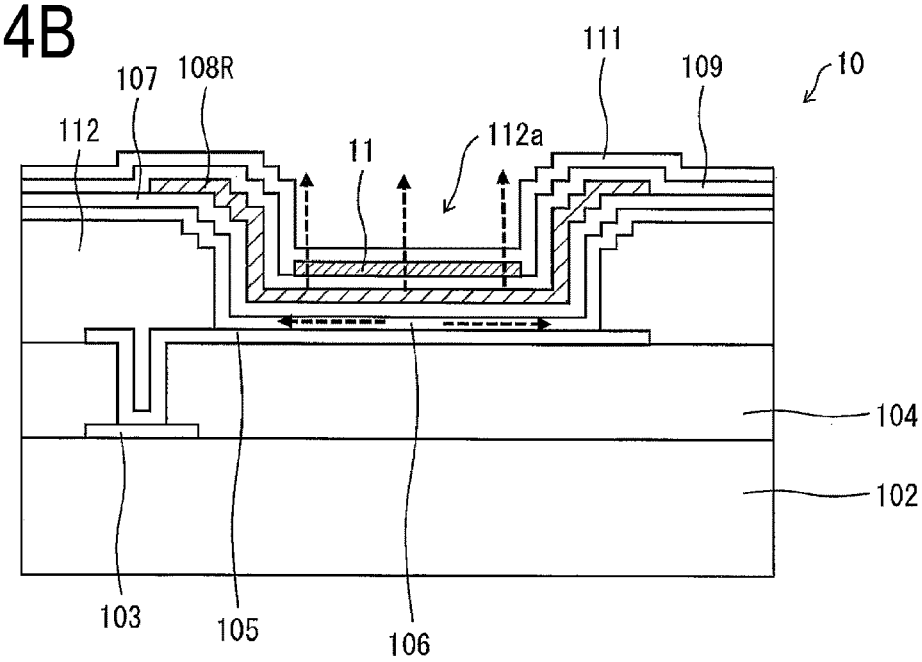
FIG. 4B is a diagram illustrating a reason why, in the organic EL display device, intense light emission can be suppressed in the peripheral area each of organic EL elements while the light emitting efficiency can be improved in the central area each of the organic EL elements.

FIG. 4A is a diagram illustrating the overall configuration of an organic EL display device 10 employing an edge cover 112 having a sharp taper angle, and FIG. 4B is a diagram illustrating a reason why, in the organic EL display device 10, intense light emission can be suppressed in the peripheral area each of organic EL elements while the light emitting efficiency can be improved in the central area each of the organic EL elements.

As illustrated in FIG. 4A, in the organic EL display device 10, the highly electrically conductive hole injection layer 106, the hole transport layer 107, any one of the light emitting layer among the red light emitting layer 108R, the green light emitting layer 108G, and the blue light emitting layer (not illustrated), the electron transport layer 109, the island-shaped electron injection layer 11, and the second electrode 111 (e.g. a metal layer) serving as a reflective electrode, are layered in that order to form organic EL elements configured to emit light of the corresponding color in the organic EL display device 10.

As illustrated in FIG. 4A, in the organic EL display device 10, the edge cover 112 having a sharp taper angle is employed. Thus, when forming a layered body in which the hole injection layer 106, the hole transport layer 107, any one of the light emitting layer among the red light emitting layer 108R, the green light emitting layer 108G, and the blue light emitting layer (not illustrated), the electron transport layer 109, the electron injection layer 11, and the second electrode 111 serving as a reflective electrode are layered in that order, the film thickness distribution changes drastically near the edge cover 112 in the layered body due to the edge cover 112 having a sharp taper angle. This results in the formation of an extremely thin part. For this reason, the peripheral area each of the organic EL elements configured to emit light of the corresponding color is the above-described extremely thin part in the layered body.

Thus, as illustrated in FIG. 4A, the organic EL display device 10 includes the hole injection layer 106 and the electron injection layer 11, when viewed in plan view, formed overlapping only inward from an end portion each of the island-shaped red light emitting layer 108R, the island-shaped green light emitting layer 108G, and the island-shaped blue light emitting layer (not illustrated).

In the present embodiment, the hole injection layer 106 is formed covering the entireties of the island-shaped red light emitting layer 108R, the island-shaped green light emitting layer 108G, and the island-shaped blue light emitting layer (not illustrated). The electron injection layer 11 is divided into a plurality of parts isolated from each other in an island shape, and each of the isolated and island-shaped parts of the electron injection layer 11 is smaller than each of the island-shaped red light emitting layer 108R, the island-shaped green light emitting layer 108G, and the island-shaped blue light emitting layer (not illustrated).

Note that in the present embodiment, it is preferable that the part of the hole injection layer 106 and the electron injection layer 11 that overlap when viewed in plan view overlaps, when viewed in plan view, with the opening 112a in the edge cover 112 formed covering the end portions of the adjacent first electrodes 105 which, of the first electrode 105 and the second electrode 111, are in a lower layer.

As illustrated in FIG. 4A, the electron injection layer 11 is not formed in the extremely thin part of the layered body, which is the peripheral area each of the organic EL elements included in the organic EL display device 10. As such, a problem in which crosstalk (current in an in-plane direction) arising in each of the organic EL elements due to horizontal current in the highly electrically conductive hole injection layer 106 results in the peripheral area each of the organic EL elements emitting intense light while the central area each of the organic EL elements has reduced light emitting efficiency can be suppressed.

In other words, as illustrated in FIG. 4B, in the organic EL elements included in the organic EL display device 10, the horizontal current in the highly electrically conductive hole injection layer 106 arises only inward from the end portion each of the island-shaped red light emitting layer 108R, the island-shaped green light emitting layer 108G, and the island-shaped blue light emitting layer (not illustrated), as indicated by the arrows in FIG. 4B. When viewed in plan view, the hole injection layer 106 and the electron injection layer 11 overlap only inward from the end portion each of the island-shaped red light emitting layer 108R, the island-shaped green light emitting layer 108G, and the island-shaped blue light emitting layer (not illustrated), and thus light is emitted from the part inward from the end portion each of the red light emitting layer 108R, the green light emitting layer 108G, and the blue light emitting layer (not illustrated). Accordingly, even in a case where the organic EL display device 10 employs the edge cover 112 having a sharp taper angle to increase the resolution, it is possible to achieve an organic EL display device 10 that suppresses intense light emission at the end portion each of the red light emitting layer 108R, the green light emitting layer 108G, and the blue light emitting layer (not illustrated) and improves the light emitting efficiency at the part inward from the end portion each of the red light emitting layer 108R, the green light emitting layer 108G, and the blue light emitting layer (not illustrated).

Figure 5:
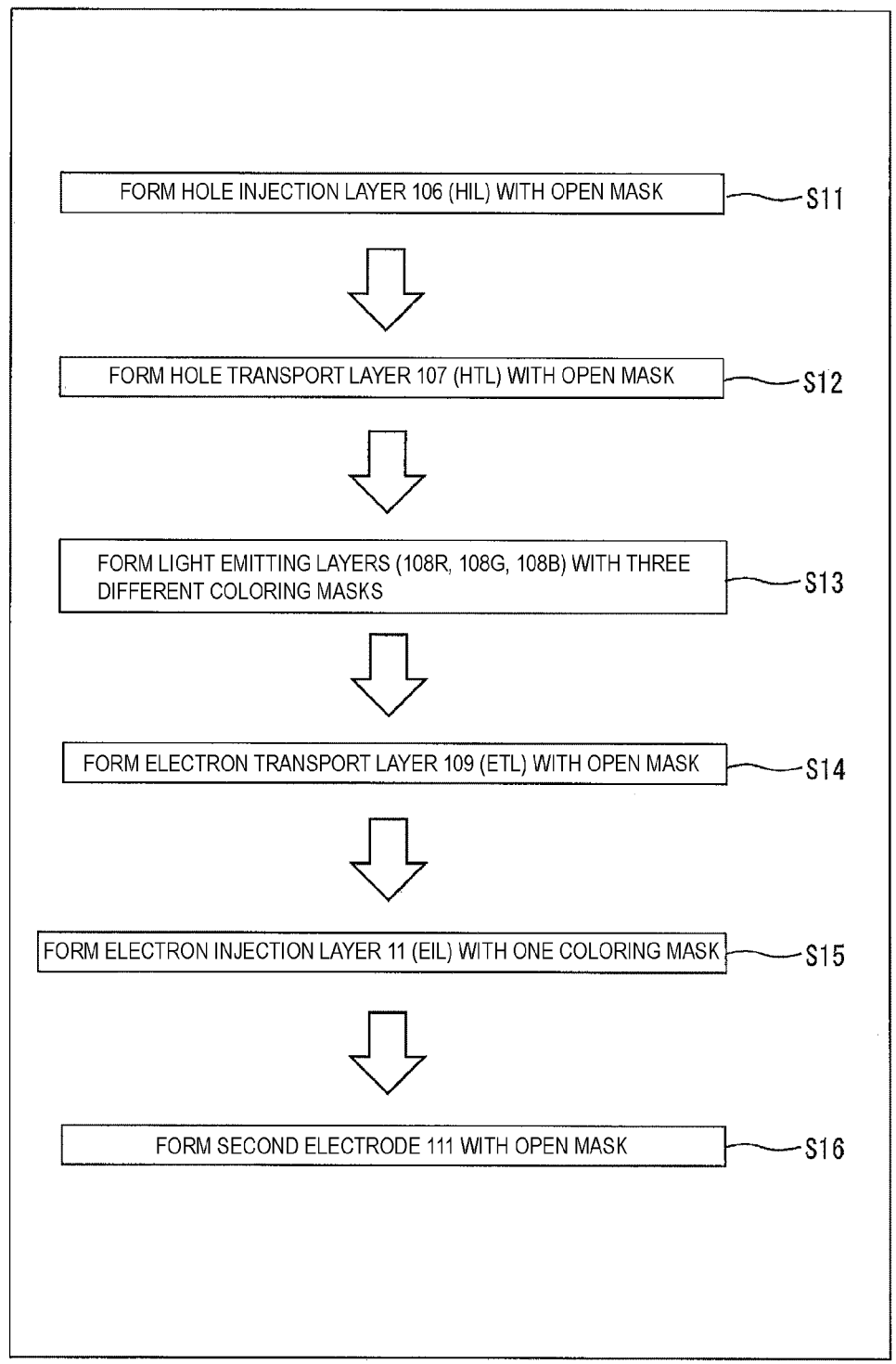
FIG. 5 is a diagram illustrating a process of manufacturing the organic EL display device illustrated in FIGS. 4A and 4B.

FIG. 5 is a diagram illustrating a process of manufacturing the organic EL display device 10 illustrated in FIGS. 4A and 4B.

As illustrated in FIG. 5, in the organic EL display device 10, the hole injection layer 106 is formed above the substrate 102 using an open mask (second mask) having a single opening, covering the first electrode 105 and the edge cover 112 (S11).

The hole transport layer 107 is then formed above the substrate 102, covering the hole injection layer 106, using an open mask having a single opening (S12).

Then, the red light emitting layer 108R, the green light emitting layer 108G, and the blue light emitting layer (not illustrated) are formed in island shapes on the corresponding hole injection layer 2 and the hole transport layer 107 above the region where the corresponding first electrode 105 is formed, using three coloring masks having a plurality of openings (S13).

The electron transport layer 109 is then formed above the substrate 102, covering the hole transport layer 107, the red light emitting layer 108R, the green light emitting layer 108G, and the blue light emitting layer (not illustrated), using an open mask having a single opening (S14).

Then, the electron injection layer 11 is formed on the electron transport layer 109 above the substrate 102 in an island shape, using a coloring mask (first mask) having a plurality of openings (S15).

Finally, the second electrode 111 is formed above the substrate 102, covering the electron injection layer 11 and the electron transport layer 109, using an open mask having a single opening (S16).

Third Embodiment

Next, a third embodiment of the disclosure will be described on the basis of FIGS. 6A to 7. An organic EL display device 20 according to the present embodiment differs from that of the first and second embodiments in that: the hole injection layer 2 is divided into a plurality of parts isolated from each other in an island shape; the electron injection layer 11 is divided into a plurality of parts isolated from each other in an island shape; the isolated and island-shaped parts of the hole injection layer 2 overlap with the respective isolated and island-shaped parts of the electron injection layer 11 when viewed in plan view; and each of the isolated and island-shaped parts of the hole injection layer 2 and each of the isolated and island-shaped parts of the electron injection layer 11 that overlap when viewed in plan view are each smaller than the island-shaped red light emitting layer 108R, the island-shaped green light emitting layer 108G, and the island-shaped blue light emitting layer (not illustrated). In other respects, the organic EL display device 20 is the same as described in the first and second embodiments. For the sake of simplicity, members having the same functions as the members illustrated in the drawings referenced in the first and second embodiments will be given the same reference signs, and descriptions thereof will be omitted.

Figure 6A:
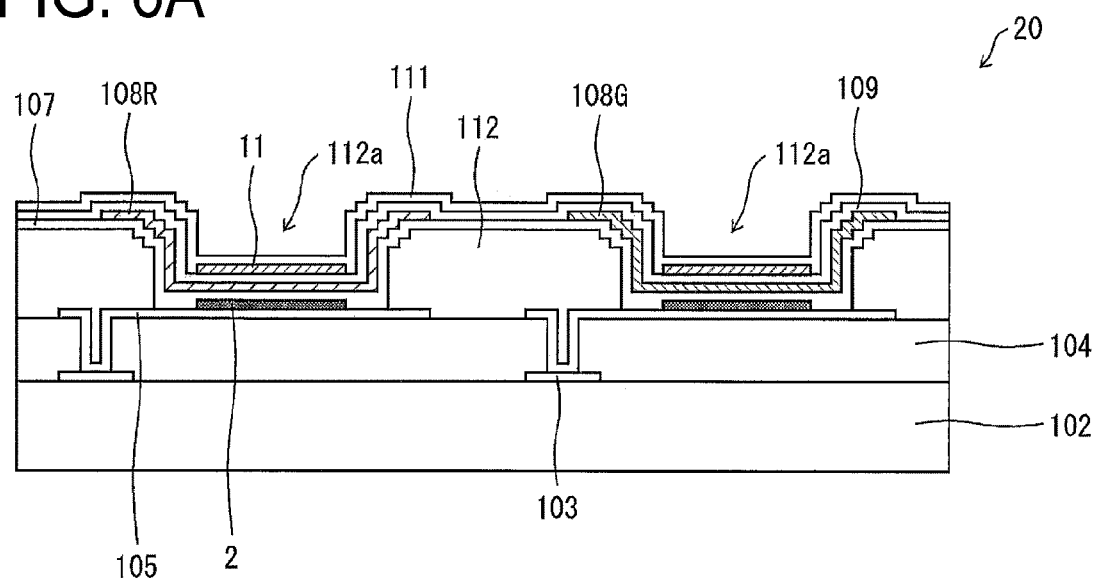
FIG. 6A is a diagram illustrating the overall configuration of an organic EL display device employing an edge cover having a sharp taper angle.
Figure 6B:
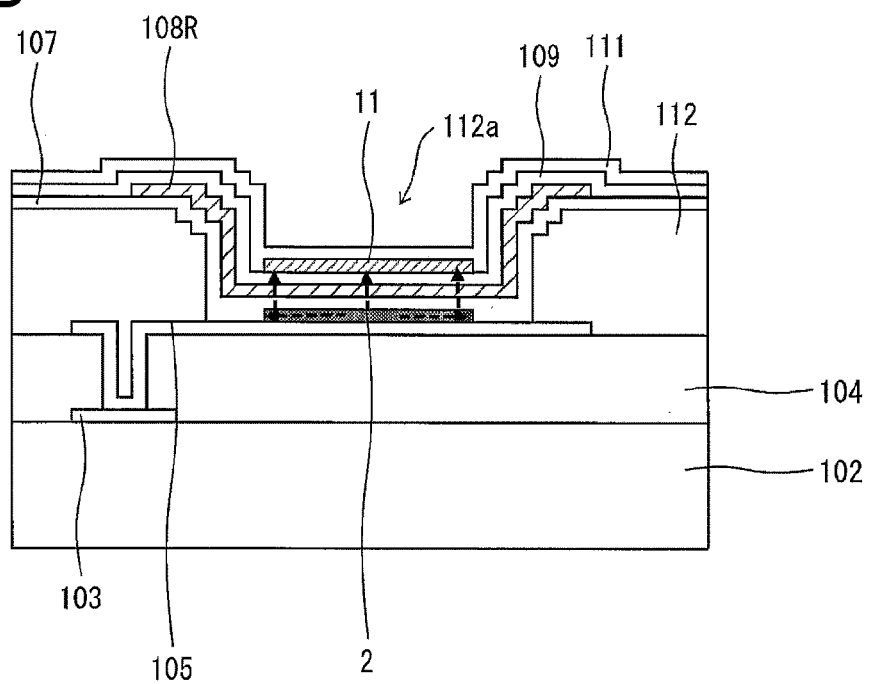
FIG. 6B is a diagram illustrating a reason why, in the organic EL display device, intense light emission can be suppressed in the peripheral area each of organic EL elements while the light emitting efficiency can be improved in the central area each of the organic EL elements.

FIG. 6A is a diagram illustrating the overall configuration of the organic EL display device 20 employing an edge cover 112 having a sharp taper angle, and FIG. 6B is a diagram illustrating a reason why, in the organic EL display device 20, intense light emission can be suppressed in a peripheral area each of organic EL elements while the light emitting efficiency can be improved in a central area each of the organic EL elements.

As illustrated in FIG. 6A, in the organic EL display device 20, the island-shaped highly electrically conductive hole injection layer 2, the hole transport layer 107, any one of the light emitting layer among the red light emitting layer 108R, the green light emitting layer 108G, and the blue light emitting layer (not illustrated), the electron transport layer 109, the island-shaped electron injection layer 11, and the second electrode 111 (e.g. a metal layer) serving as a reflective electrode are layered in that order to form organic EL elements configured to emit light of the corresponding color in the organic EL display device 20.

As illustrated in FIG. 6A, in the organic EL display device 20, the edge cover 112 having a sharp taper angle is employed. Thus, when forming a layered body in which the hole injection layer 2, the hole transport layer 107, any one of the light emitting layer among the red light emitting layer 108R, green light emitting layer 108G, and blue light emitting layer (not illustrated), the electron transport layer 109, the electron injection layer 11, and the second electrode 111 serving as a reflective electrode are layered in that order, the film thickness distribution changes drastically near the edge cover 112 in the layered body due to the edge cover 112 having a sharp taper angle. This results in the formation of an extremely thin part. For this reason, the peripheral area each of the organic EL elements configured to emit light of the corresponding color is the above-described extremely thin part in the layered body.

Thus, as illustrated in FIG. 6A, the organic EL display device 20 includes the island-shaped hole injection layer 2 and the island-shaped electron injection layer 11, when viewed in plan view, formed overlapping only inward from an end portion each of the island-shaped red light emitting layer 108R, the island-shaped green light emitting layer 108G, and the island-shaped blue light emitting layer (not illustrated).

In the present embodiment, the hole injection layer 2 is divided into a plurality of parts isolated from each other in an island shape; the electron injection layer 11 is divided into a plurality of parts isolated from each other in an island shape; the isolated and island-shaped parts of the hole injection layer 2 overlap with the isolated and island-shaped parts of the electron injection layer 11 when viewed in plan view; and each of the isolated and island-shaped parts of the hole injection layer 2 and each of the isolated and island-shaped parts of the electron injection layer 11 that overlap when viewed in plan view are each smaller than the island-shaped red light emitting layer 108R, the island-shaped green light emitting layer 108G, and the island-shaped blue light emitting layer (not illustrated).

Note that in the present embodiment, it is preferable that the part of the hole injection layer 2 and the electron injection layer 11 that overlap when viewed in plan view overlap, when viewed in plan view, with the opening 112a in the edge cover 112 formed covering the end portions of the adjacent first electrodes 105 which, of the first electrode 105 and the second electrode 111, are in a lower layer.

As illustrated in FIG. 6A, the hole injection layer 2 and the electron injection layer 11 are not formed in the extremely thin part of the layered body, which is the peripheral area each of the organic EL elements included in the organic EL display device 20. As such, a problem in which crosstalk (current in an in-plane direction) arising in each of the organic EL elements due to horizontal current in the highly electrically conductive hole injection layer 2 results in the peripheral area each of the organic EL elements emitting intense light while the central area each of the organic EL elements have reduced light emitting efficiency can be suppressed.

In other words, as illustrated in FIG. 6B, in the organic EL elements included in the organic EL display device 20, the horizontal current in the highly electrically conductive hole injection layer 2 arises only inward from the end portion each of the island-shaped red light emitting layer 108R, the island-shaped green light emitting layer 108G, and the island-shaped blue light emitting layer (not illustrated), as indicated by the arrows in FIG. 6B. When viewed in plan view, the hole injection layer 2 and the electron injection layer 11 overlap only inward from the end portion each of the island-shaped red light emitting layer 108R, the island-shaped green light emitting layer 108G, and the island-shaped blue light emitting layer (not illustrated), and thus light is emitted from the part inward from the end portion each of the red light emitting layer 108R, the green light emitting layer 108G, and the blue light emitting layer (not illustrated). Accordingly, even in a case where the organic EL display device 20 employs the edge cover 112 having a sharp taper angle to increase the resolution, it is possible to achieve an organic EL display device 20 that suppresses intense light emission at the end portion each of the red light emitting layer 108R, the green light emitting layer 108G, and the blue light emitting layer (not illustrated) and improves the light emitting efficiency at the part inward from the end portion each of the red light emitting layer 108R, the green light emitting layer 108G, and the blue light emitting layer (not illustrated).

Figure 7:
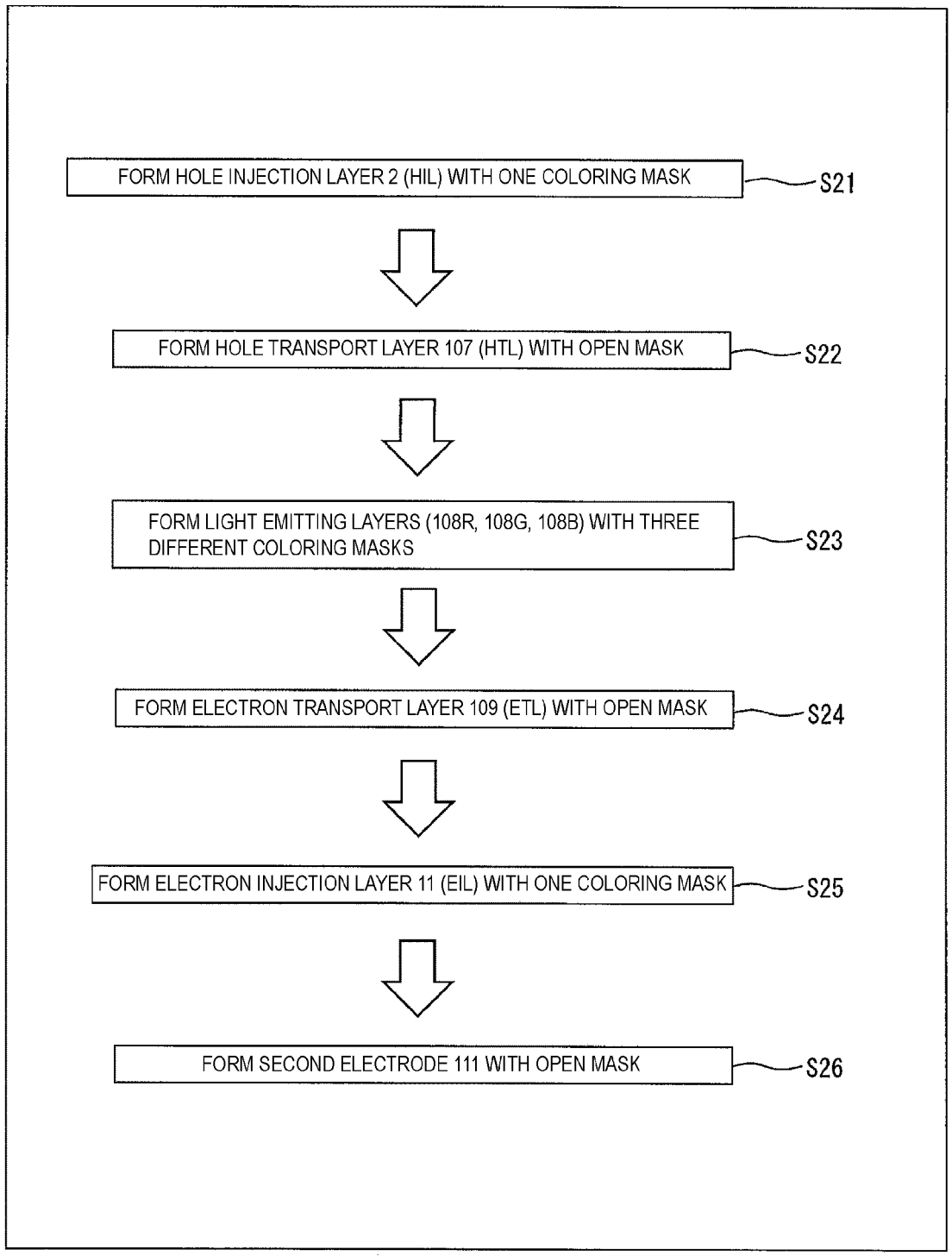
FIG. 7 is a diagram illustrating a process of manufacturing the organic EL display device illustrated in FIGS. 6A and 6B.

FIG. 7 is a diagram illustrating a process of manufacturing the organic EL display device 20 illustrated in FIGS. 6A and 6B.

As illustrated in FIG. 7, in the organic EL display device 20, the hole injection layer 2 is formed in an island shape above the substrate 102 using a coloring mask (first mask) having a plurality of openings, covering the first electrode 105 and the edge cover 112 (S21).

The hole transport layer 107 is then formed above the substrate 102, covering the hole injection layer 2 and the first electrode 105, using an open mask having a single opening (S22).

Then, the red light emitting layer 108R, the green light emitting layer 108G, and the blue light emitting layer (not illustrated) are formed in island shapes on the corresponding hole injection layer 2 and the hole transport layer 107 above the region where the corresponding first electrode 105 is formed, using three coloring masks having a plurality of openings (S23).

The electron transport layer 109 is then formed above the substrate 102, covering the hole transport layer 107, the red light emitting layer 108R, the green light emitting layer 108G, and the blue light emitting layer (not illustrated), using an open mask having a single opening (S24).

Then, the electron injection layer 11 is formed on the electron transport layer 109 above the substrate 102 in an island shape, using a coloring mask (third mask) having a plurality of openings (S25).

Finally, the second electrode 111 is formed above the substrate 102, covering the electron injection layer 11 and the electron transport layer 109, using an open mask having a single opening (S26).

Note that in the present embodiment, the coloring mask (first mask) having a plurality of openings, used when forming the hole injection layer 2, and the coloring mask (third mask) having a plurality of openings, used when forming the electron injection layer 11, may be the same mask.

Fourth Embodiment

Next, a fourth embodiment of the disclosure will be described on the basis of FIGS. 8 to 13B. An organic EL display device 30 according to the present embodiment differs from that of the first to third embodiments in that: a hole injection layer 22 is divided into a plurality of parts isolated from each other in an island shape; an electron injection layer 23 is divided into a plurality of parts isolated from each other in an island shape; one of each of the isolated and island-shaped parts of the hole injection layer 22 and each of the isolated and island-shaped parts of the electron injection layer 23 overlaps with two light emitting layers adjacent to each other in one direction among the island-shaped red light emitting layers 108R, the island-shaped green light emitting layers 108G, and the island-shaped blue light emitting layers 108B, when viewed in plan view; and the other of each of the isolated and island-shaped parts of the hole injection layer 22 and each of the isolated and island-shaped parts of the electron injection layer 23 overlaps with one of the two light emitting layers adjacent to each other in one direction when viewed in plan view. In other respects, the organic EL display device 30 is as described in the first to third embodiments. For the sake of simplicity, members having the same functions as the members illustrated in the drawings referenced in the first to third embodiments will be given the same reference signs, and descriptions thereof will be omitted.

Figure 8:
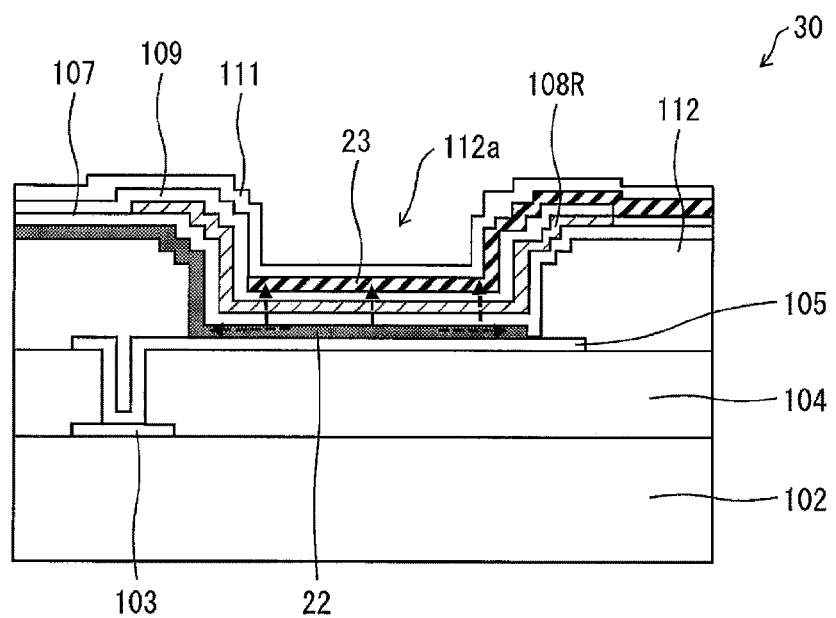
FIG. 8 is a diagram illustrating the overall configuration of an organic EL display device employing an edge cover having a sharp taper angle, and a reason why intense light emission can be suppressed in the peripheral area of organic EL elements while the light emitting efficiency can be improved in the central area each of the organic EL elements.

FIG. 8 is a diagram illustrating the overall configuration of the organic EL display device 30 employing an edge cover 112 having a sharp taper angle, and a reason why intense light emission can be suppressed in a peripheral area each of organic EL elements while the light emitting efficiency can be improved in a central area each of the organic EL elements.

As illustrated in FIG. 8, in the organic EL display device 30, the island-shaped highly electrically conductive hole injection layer 22, the hole transport layer 107, any one of the light emitting layer among the island-shaped red light emitting layer 108R, the island-shaped green light emitting layer (not illustrated), and the island-shaped blue light emitting layer (not illustrated), the electron transport layer 109, the island-shaped electron injection layer 23, and the second electrode 111 (e.g. a metal layer) serving as a reflective electrode, are layered in that order to form the organic EL elements configured to emit light of the corresponding color in the organic EL display device 30.

As illustrated in FIG. 8, the hole injection layer 22 is divided into a plurality of parts isolated from each other in an island shape; the electron injection layer 23 is divided into a plurality of parts isolated from each other in an island shape; one of each of the isolated and island-shaped parts of the hole injection layer 22 and each of the isolated and island-shaped parts of the electron injection layer 23 overlaps with two light emitting layers adjacent to each other in one direction among the island-shaped red light emitting layers 108R, the island-shaped green light emitting layers 108G, and the island-shaped blue light emitting layers 108B, when viewed in plan view; and the other of each of the isolated and island-shaped parts of the hole injection layer 22 and each of the isolated and island-shaped parts of the electron injection layer 23 overlaps with one of the two light emitting layers adjacent to each other in one direction when viewed in plan view.

Note that in the present embodiment, it is preferable that the parts of the hole injection layer 22 and the electron injection layer 23 that overlap when viewed in plan view overlap, when viewed in plan view, with the opening 112a in the edge cover 112 formed covering the end portions of the adjacent first electrodes 105 which, of the first electrode 105 and the second electrode 111, are in a lower layer.

Figure 9:
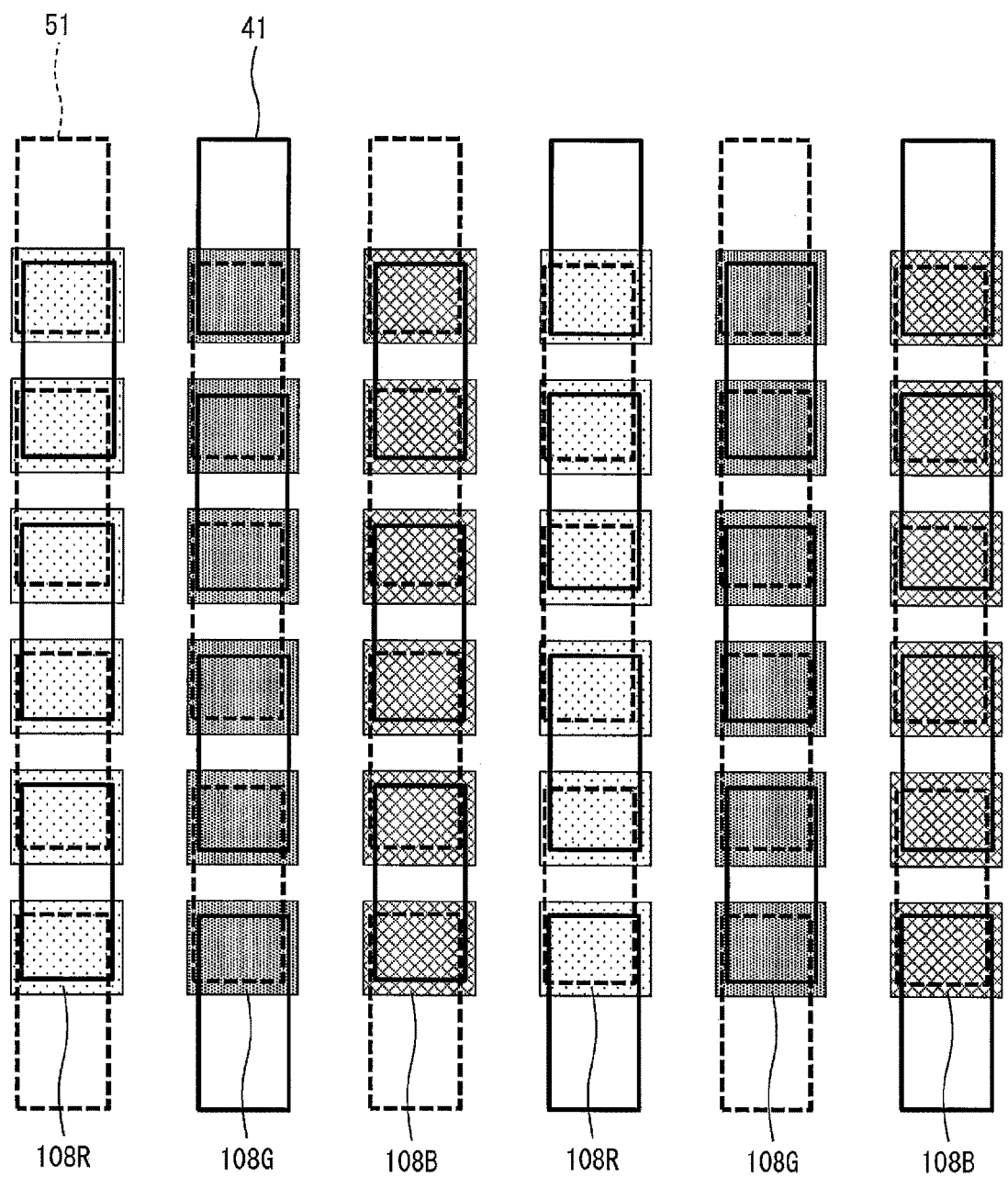
FIG. 9 is a diagram illustrating positions where a coloring mask having a plurality of openings and used in a process of forming a hole injection layer, and a coloring mask having a plurality of openings and used in a process of forming an electron injection layer, are arranged with respect to a red light emitting layer, a green light emitting layer, and a blue light emitting layer, each which is formed having an island shape.

FIG. 9 is a diagram illustrating positions where a coloring mask 40 having a plurality of openings 41 and used in a process of forming the hole injection layer 22, and a coloring mask 50 having a plurality of openings 51 and used in a process of forming the electron injection layer 23, are arranged with respect to the island-shaped red light emitting layer 108R, the island-shaped green light emitting layer 108G, and the island-shaped blue light emitting layer 108B.

Figure 10A:
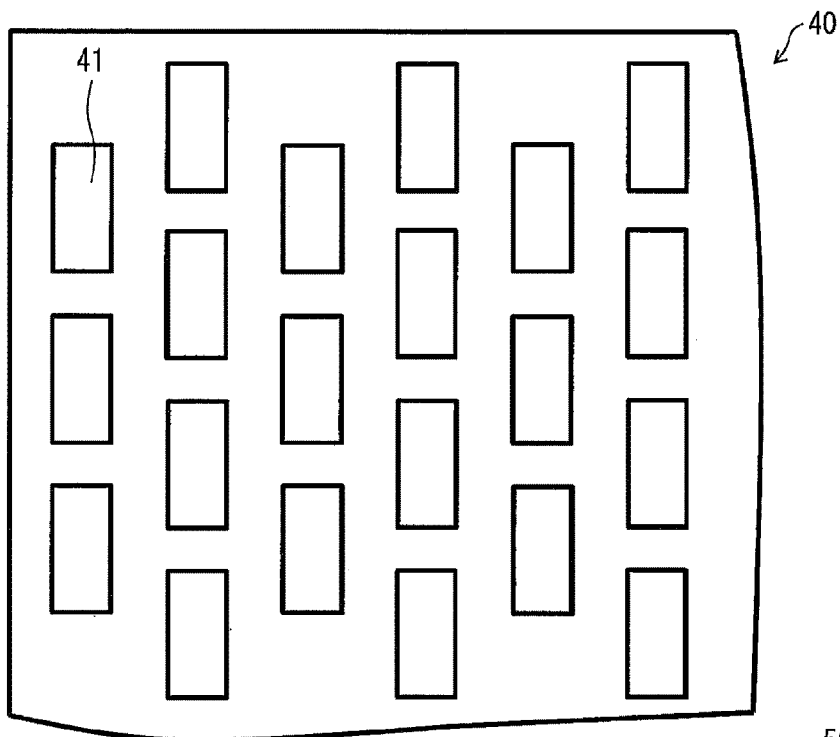
FIG. 10A is a diagram illustrating the overall configuration of a coloring mask having a plurality of openings and used in a process of forming a hole injection layer.
Figure 10B:
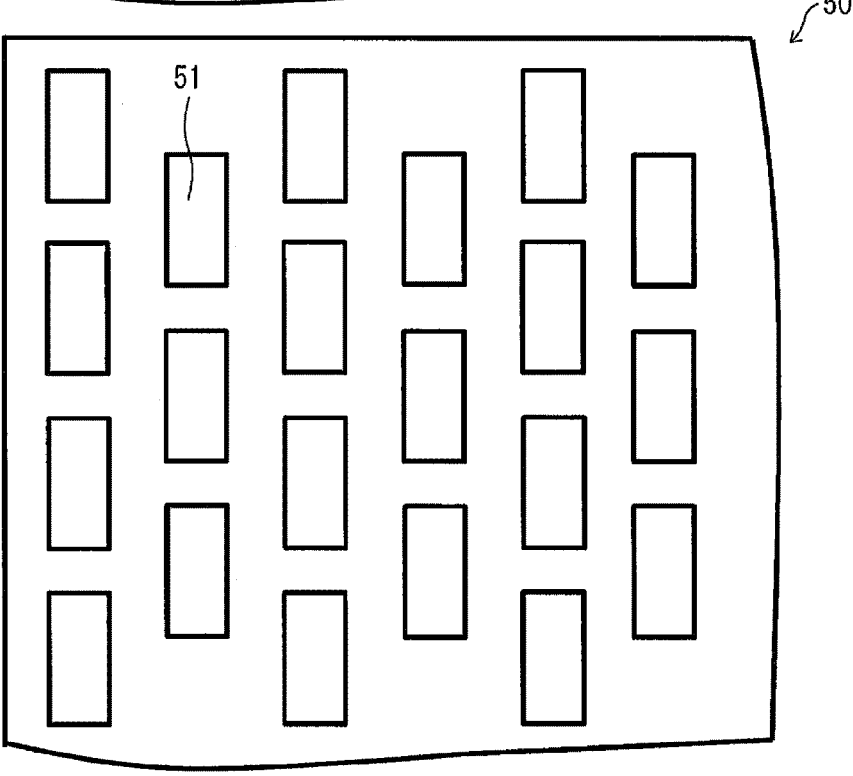
FIG. 10B is a diagram illustrating the overall configuration of a coloring mask having a plurality of openings and used in a process of forming an electron injection layer.

FIG. 10A is a diagram illustrating the overall configuration of the coloring mask 40 having the plurality of openings 41 and used in the process of forming the hole injection layer 22, and FIG. 10B is a diagram illustrating the overall configuration of the coloring mask 50 having the plurality of openings 51 and used in the process of forming the electron injection layer 23.

As illustrated in FIGS. 10A and 10B, each of the plurality of openings 51 in the coloring mask 50 used in the process of forming the electron injection layer 23 partially overlaps, when viewed in plan view, with two of the openings 41, adjacent to each other in the vertical direction in FIG. 10A, in the coloring mask 40 used in the process of forming the hole injection layer 22.

As illustrated in FIGS. 10A and 10B, although the plurality of openings 41 in the coloring mask 40 and the plurality of openings 51 in the coloring mask 50 are formed having rectangular shapes, the openings are not limited thereto, and may have hook shapes instead, for example, as will be described later.

As illustrated in FIG. 9, the island-shaped part of the hole injection layer 22 formed via the opening 41 in the coloring mask 40 overlaps, when viewed in plan view, with two light emitting layers adjacent to each other in the vertical directions in FIG. 9 among the island-shaped red light emitting layers 108R, the island-shaped green light emitting layers 108G, and the island-shaped blue light emitting layers 108B.

The island-shaped part of the electron injection layer 23 formed via the opening 51 in the coloring mask 50 overlaps, when viewed in plan view, with one of the aforementioned two light emitting layers.

By arranging the coloring mask 40 having the plurality of openings 41 and the coloring mask 50 having the plurality of openings 51 with respect to the island-shaped red light emitting layer 108R, the island-shaped green light emitting layer 108G, and the island-shaped blue light emitting layer 108B as illustrated in FIG. 9 and then forming the hole injection layer 22 and the electron injection layer 23, the hole injection layer 22 and the electron injection layer 23 can be made to overlap, when viewed in plan view, only inward from the end portion each of the island-shaped red light emitting layer 108R, the island-shaped green light emitting layer 108G, and the island-shaped blue light emitting layer 108B.

As illustrated in FIG. 9, the island-shaped parts of the hole injection layer 22 formed via the openings 41 in the coloring mask 40 and the island-shaped parts of the electron injection layer 23 formed via the openings 51 in the coloring mask 50 overlap, when viewed in plan view, only inward from the end portion each of the island-shaped red light emitting layer 108R, the island-shaped green light emitting layer 108G, and the island-shaped blue light emitting layer 108B.

As described above, in the organic EL display device 30 illustrated in FIG. 8, the hole injection layer 22 is divided into a plurality of parts isolated from each other in an island shape, and the electron injection layer 23 is divided into a plurality of parts isolated from each other in an island shape. Each of the isolated and island-shaped parts of the hole injection layer 22 forms a first island group so that each of the isolated and island-shaped parts of the hole injection layer 22 overlaps with a plurality of the island-shaped light emitting layers among the light emitting layers 108R, 108G, and 108B when viewed in plan view. Each of the isolated and island-shaped parts of the electron injection layer 23 forms a second island group so that each of the isolated and island-shaped parts of the electron injection layer 23 overlaps with a plurality of the island-shaped light emitting layers among the light emitting layers 108R, 108G, and 108B when viewed in plan view. One of the plurality of the island-shaped light emitting layers among the light emitting layers 108R, 108G, and 108B overlapping with the first island group when viewed in plan view is identical to one of the plurality of the island-shaped light emitting layers among the light emitting layers 108R, 108G, and 108B overlapping with the second island group when viewed in plan view.

The plurality of the island-shaped light emitting layers among the light emitting layers 108R, 108G, and 108B overlapping with the first island group when viewed in plan view may be two adjacent light emitting layers, and the plurality of the island-shaped light emitting layers among the light emitting layers 108R, 108G, and 108B overlapping with the second island group when viewed in plan view may be two adjacent light emitting layers.

Figure 11:
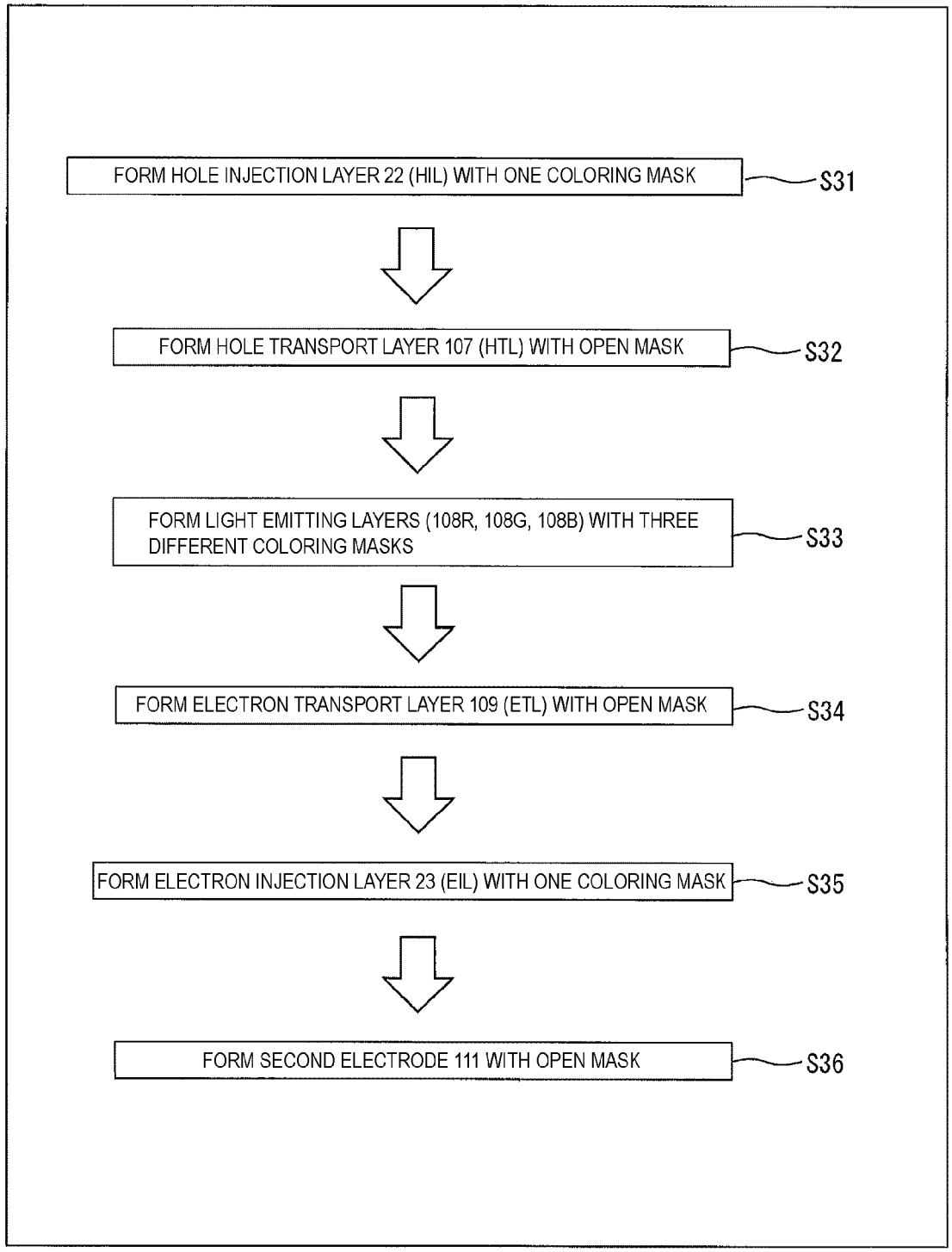
FIG. 11 is a diagram illustrating a process of manufacturing the organic EL display device illustrated in FIG. 8.

FIG. 11 is a diagram illustrating a process of manufacturing the organic EL display device 30 illustrated in FIG. 8.

As illustrated in FIG. 11, in the organic EL display device 30, the hole injection layer 22 is formed in an island shape above the substrate 102 using the coloring mask 40 (fourth mask) having the plurality of openings 41 as illustrated in FIG. 10A, covering the first electrode 105 and the edge cover 112 (S31).

The hole transport layer 107 is then formed above the substrate 102, covering the hole injection layer 22 and the first electrode 105, using an open mask having a single opening (S32).

Then, the red light emitting layer 108R, the green light emitting layer 108G, and the blue light emitting layer 108B are formed in island shapes on the corresponding hole injection layer 22 and the hole transport layer 107 above the region where the corresponding first electrode 105 is formed, using three coloring masks having a plurality of openings (S33).

The electron transport layer 109 is then formed above the substrate 102, covering the hole transport layer 107, the red light emitting layer 108R, the green light emitting layer (not illustrated), and the blue light emitting layer (not illustrated), using an open mask having a single opening (S34).

Then, the electron injection layer 23 is formed on the electron transport layer 109 above the substrate 102 in an island shape, using the coloring mask 50 (fifth mask) having the plurality of openings 51 as illustrated in FIG. 10B (S35).

Finally, the second electrode 111 is formed above the substrate 102, covering the electron injection layer 23 and the electron transport layer 109, using an open mask having a single opening (S36).

The present embodiment describes a case where the coloring mask 40 having the plurality of openings 41, used when forming the hole injection layer 22, and the coloring mask 50 having the plurality of openings 51, used when forming the electron injection layer 23, are different masks, as one example. However, the configuration is not limited thereto, and the coloring mask 40 having the plurality of openings 41, used when forming the hole injection layer 22, and the coloring mask 50 having the plurality of openings 51, used when forming the electron injection layer 23, may be the same mask.

In the case where the coloring mask 40 having the plurality of openings 41, used when forming the hole injection layer 22, and the coloring mask 50 having the plurality of openings 51, used when forming the electron injection layer 23, are the same mask, one of the masks can be moved and used when forming the electron injection layer 23. The openings in the mask after the mask is moved in one direction partially overlap, when viewed in plan view, with two openings, in the pre-movement mask, that are adjacent to each other in the vertical direction in the drawings.

The present embodiment describes a case where, as illustrated in FIGS. 10A and 10B, the plurality of openings 41 in the coloring mask 40 and the plurality of openings 51 in the coloring mask 50 are formed having rectangular shapes that are longer in the vertical direction in the drawings as one example. However, the shapes are not limited thereto, and the plurality of openings 41 in the coloring mask 40 and the plurality of openings 51 in the coloring mask 50 may be formed having rectangular shapes that are longer in the horizontal direction in FIGS. 10A and 10B.

Figure 12A:
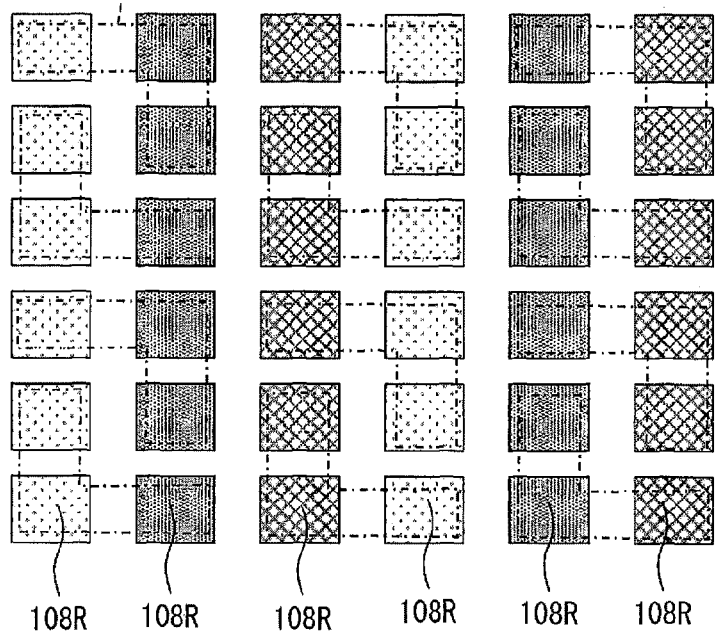
FIG. 12A is a diagram illustrating a position where a coloring mask having a plurality of openings, which can be used in a process of forming a hole injection layer, is arranged with respect to a red light emitting layer, a green light emitting layer, and a blue light emitting layer, each which is formed having an island shape.
Figure 12B:
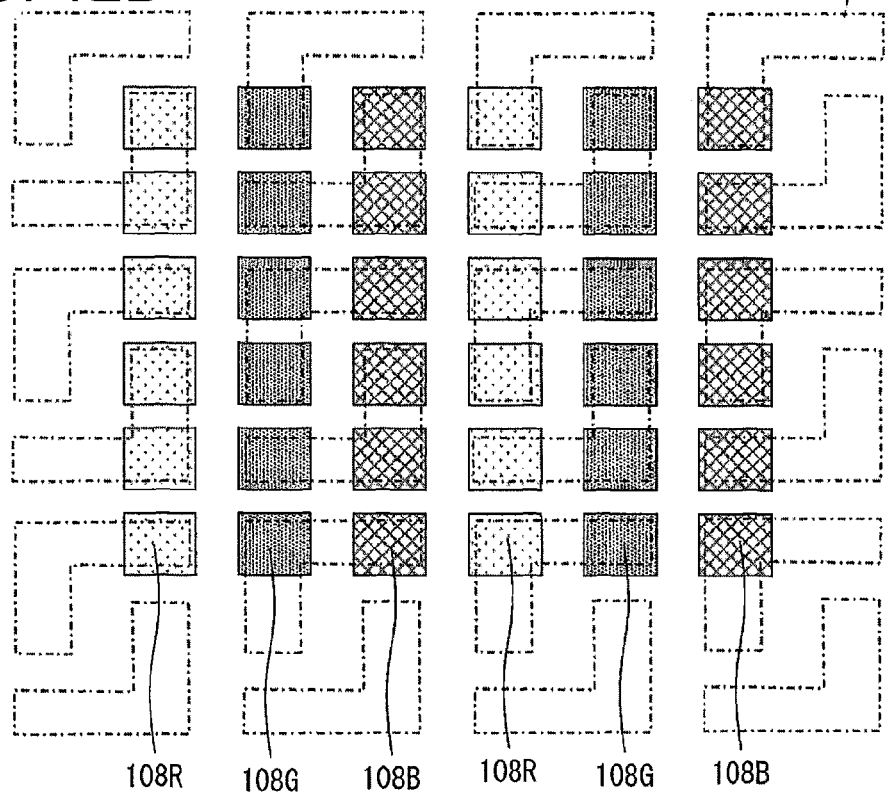
FIG. 12B is a diagram illustrating a position where a coloring mask having a plurality of openings, which can be used in a process of forming an electron injection layer, is arranged with respect to a red light emitting layer, a green light emitting layer, and a blue light emitting layer, each which is formed having an island shape.

FIG. 12A is a diagram illustrating a position where a coloring mask 60 having a plurality of openings 61, which can be used in a process of forming the hole injection layer 22, is arranged with respect to the island-shaped red light emitting layer 108R, the island-shaped green light emitting layer 108G, and the island-shaped blue light emitting layer 108B, and FIG. 12B is a diagram illustrating a position where a coloring mask 70 having a plurality of openings 71, which can be used in a process of forming the electron injection layer 23, is arranged with respect to the island-shaped red light emitting layer 108R, the island-shaped green light emitting layer 108G, and the island-shaped blue light emitting layer 108B.

Figure 13A:
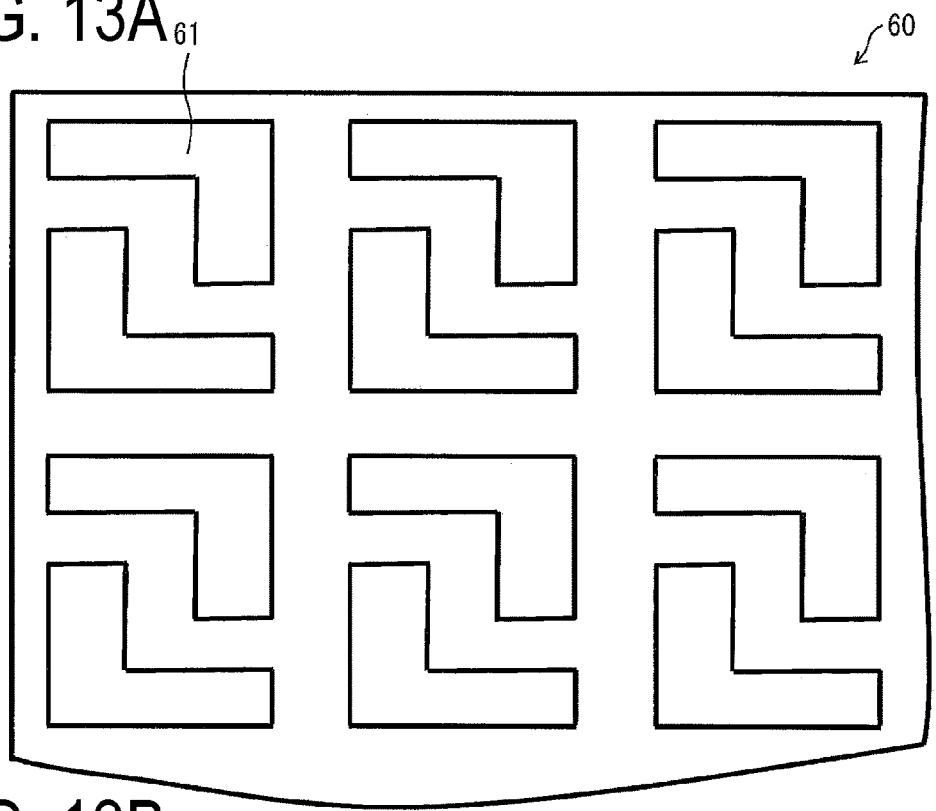
FIG. 13A is a diagram illustrating the overall configuration of a coloring mask having a plurality of openings, which can be used in a process of forming a hole injection layer.
Figure 13B:
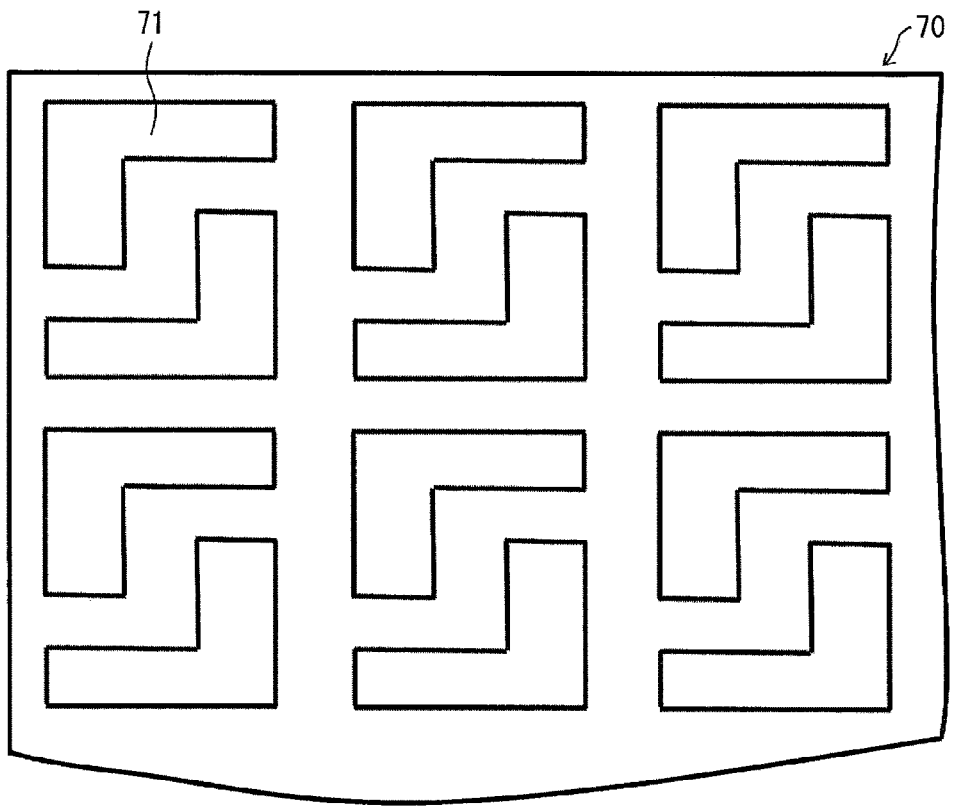
FIG. 13B is a diagram illustrating the overall configuration of a coloring mask having a plurality of openings, which can be used in a process of forming an electron injection layer.
Figure 14A:
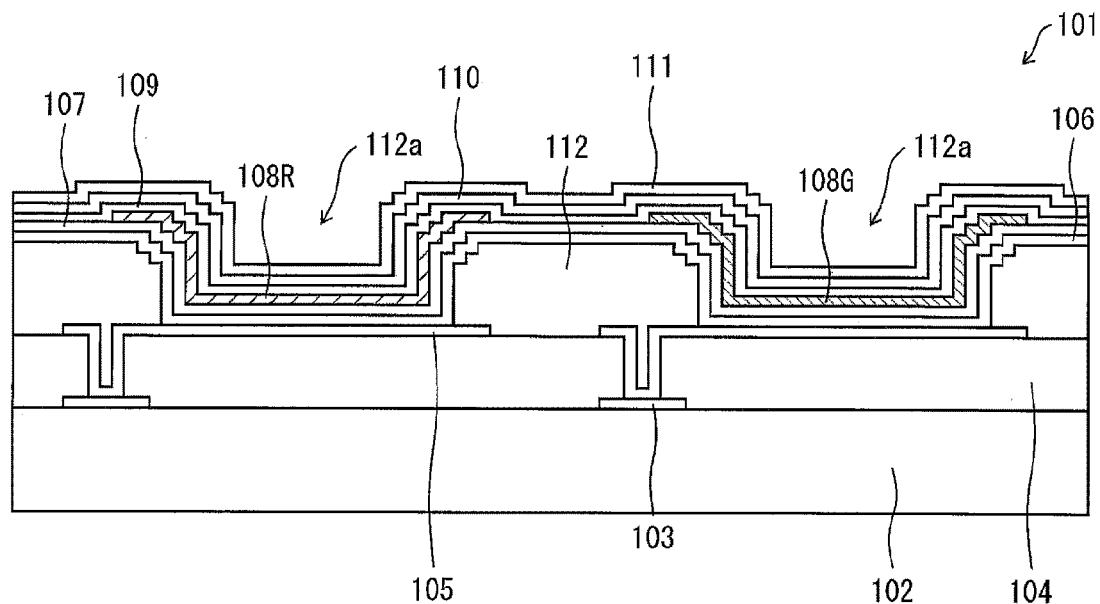
FIG. 14A is a diagram illustrating the overall configuration of a known organic EL display device including an edge cover.
Figure 14B:
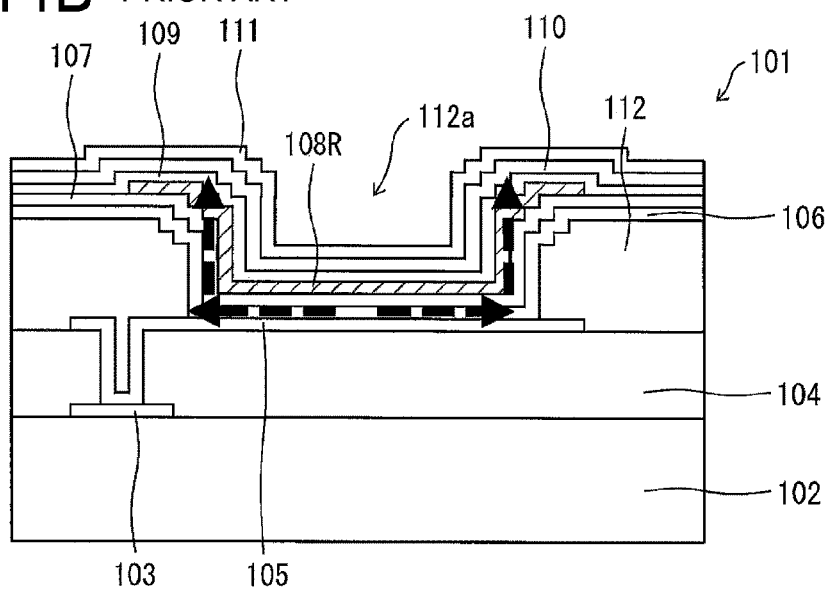
FIG. 14B is a diagram illustrating a problem with the known organic EL display device including an edge cover.
Figure 15:
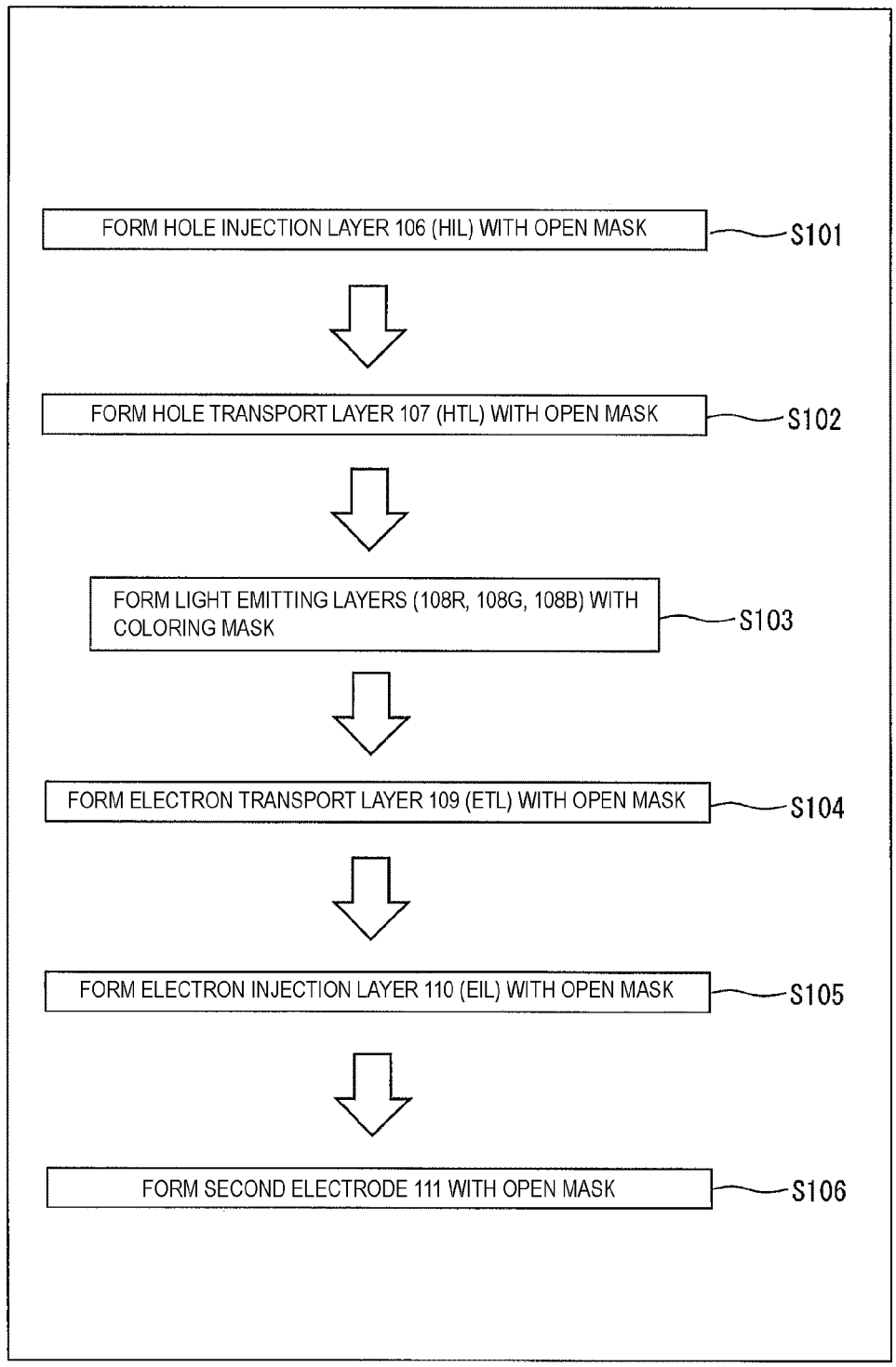
FIG. 15 is a diagram illustrating a process of manufacturing the known organic EL display device illustrated in FIG. 14A.

FIG. 13A is a diagram illustrating the overall configuration of the coloring mask 60 having the plurality of openings 61, which can be used in the process of forming the hole injection layer 22, and FIG. 13B is a diagram illustrating the overall configuration of the coloring mask 70 having the plurality of openings 71, which can be used in the process of forming the electron injection layer 23.

As illustrated in FIGS. 12A to 13B, the plurality of openings 61 in the coloring mask 60 and the plurality of openings 71 in the coloring mask 70 are formed having L shapes (hook shapes).

As illustrated in FIGS. 12A and 12B, the island-shaped part of the hole injection layer 22 formed via the opening 61 in the coloring mask 60 overlaps, when viewed in plan view, with three light emitting layers adjacent to each other in the vertical direction and horizontal direction in the drawings among the island-shaped red light emitting layers 108R, the island-shaped green light emitting layers 108G, and the island-shaped blue light emitting layer 108Bs.

Additionally, the island-shaped part of the electron injection layer 23 formed via the opening 71 in the coloring mask 70 overlaps, when viewed in plan view, with three light emitting layers adjacent to each other in the vertical direction and horizontal direction in the drawings among the island-shaped red light emitting layers 108R, the island-shaped green light emitting layers 108G, and the island-shaped blue light emitting layers 108B.

In other words, the hole injection layer 22 is divided into a plurality of parts isolated from each other in an island shape, and the electron injection layer 23 is divided into a plurality of parts isolated from each other in an island shape. Each of the isolated and island-shaped parts of the hole injection layer 22 forms a first island group so that each of the isolated and island-shaped parts of the hole injection layer 22 overlaps with a plurality of light emitting layers among the island-shaped light emitting layers 108R, 108G, and 108B when viewed in plan view. Each of the isolated and island-shaped parts of the electron injection layer 23 forms a second island group so that each of the isolated and island-shaped parts of the electron injection layer 23 overlaps with a plurality of light emitting layers among the island-shaped light emitting layers 108R, 108G, and 108B when viewed in plan view. One of the plurality of the island-shaped light-emitting layers among the light emitting layers 108R, 108G, and 108B overlapping with the first island group when viewed in plan view is identical to one of the plurality of the island-shaped light emitting layers among the light emitting layers 108R, 108G, and 108B overlapping with the second island group when viewed in plan view.

The plurality of the island-shaped light emitting layers 108R, 108G, and 108B overlapping with the first island group when viewed in plan view may be three light emitting layers that are mutually adjacent to each other and arranged in a L shape (hook shape), and the plurality of the island-shaped light emitting layers 108R, 108G, and 108B overlapping with the second island group when viewed in plan view may be three light emitting layers that are mutually adjacent to each other and arranged in a L shape (hook shape).

By arranging the coloring mask 60 having the plurality of openings 61 and the coloring mask 70 having the plurality of openings 71 with respect to the island-shaped red light emitting layer 108R, the island-shaped green light emitting layer 108G, and the island-shaped blue light emitting layer 108B as illustrated in FIGS. 12A and 12B and then forming the hole injection layer 22 and the electron injection layer 23, the hole injection layer 22 and the electron injection layer 23 can be made to overlap, when viewed in plan view, with only the inner sides from the end portion each of the island-shaped red light emitting layer 108R, the island-shaped green light emitting layer 108G, and the the island-shaped blue light emitting layer 108B.

As illustrated in FIGS. 12A and 12B, the hole injection layer 22 formed having respective island shapes by means of the openings 61 in the coloring mask 60 and the electron injection layer 23 formed having respective island shapes by means of the openings 71 in the coloring mask 70 overlap, when viewed in plan view, only inward from the end portion each of the island-shaped red light emitting layer 108R, the island-shaped green light emitting layer 108G, and the island-shaped blue light emitting layer 108B.

As described above, in the case where any of the coloring mask 40 having the openings 41 illustrated in FIG. 10A, the coloring mask 50 having the openings 51 illustrated in FIG. 10B, the coloring mask 60 having the openings 61 illustrated in FIG. 13A, or the coloring mask 70 having the openings 71 illustrated in FIG. 13B is used as the mask, the size of the openings in the mask can be increased. This makes it easier to form the openings in the mask, which helps increase the resolution. This also increases the rigidity of the mask, which reduces warping; this makes it possible to reduce imprecise deposition.

Supplement

An EL display device according to a first aspect of the disclosure includes a first electrode, a second electrode opposing the first electrode, light emitting layers each formed having an island shape, between the first electrode and the second electrode, a hole injection layer provided between the first electrode and each of the light emitting layers, and an electron injection layer provided between the second electrode and each of the light emitting layers. The hole injection layer and the electron injection layer overlap only inward from an end portion each of the light emitting layers, when viewed in plan view.

According to the above-described configuration, the hole injection layer and the electron injection layer overlap only inward from the end portion each of the light emitting layers, and thus light is emitted only at the part inward from the end portion each of the light emitting layers. Accordingly, even in a case where the organic EL display device employs an edge cover having a sharp taper angle to increase the resolution, it is possible to achieve an organic EL display device that suppresses intense light emission at the end portion each of the light emitting layers and improves the light emitting efficiency at the part inward from the end portion each of the light emitting layers.

According to an EL display device of a second aspect of the disclosure, in the first aspect, the electron injection layer may be formed covering the entireties of the light emitting layers; the hole injection layer may be divided into a plurality of part isolated from each other in an island shape; and each of the plurality of parts isolated from each other in an island shape of the hole injection layer may be smaller than each of the light emitting layers.

According to this configuration, an EL display device that suppresses intense light emission at the end portion each of the light emitting layers while improving the light emitting efficiency inward from the end portion each of the light emitting layers can be achieved.

According to an EL display device of a third aspect of the disclosure, in the first aspect, the hole injection layer may be formed overlapping with the entireties of the light emitting layers when viewed in plan view; the electron injection layer may be divided into a plurality of parts isolated from each other in an island shape; and each of the plurality of parts isolated from each other in an island shape of the electron injection layer may be smaller than each of the light emitting layers.

According to this configuration, an EL display device that suppresses intense light emission at the end portion each of the light emitting layers while improving the light emitting efficiency inward from the end portion each of the light emitting layers can be achieved.

According to an EL display device of a fourth aspect of the disclosure, in the first aspect, the hole injection layer may be divided into a plurality of parts isolated from each other in an island shape; the electron injection layer may be divided into a plurality of parts isolated from each other in an island shape; each of the plurality of parts isolated from each other in an island of the hole injection layer may overlap with each of the plurality of parts isolated from each other in an island shape of the electron injection layer when viewed in plan view; and each of the plurality of parts isolated from each other in an island shape of the hole injection layer and each of the plurality of parts isolated from each other in an island shape of the electron injection layer that overlap when viewed in plan view may be each smaller than each of the light emitting layers.

According to this configuration, an EL display device that suppresses intense light emission at the end portion each of the light emitting layers while improving the light emitting efficiency inward from the end portion each of the light emitting layers can be achieved.

According to an EL display device of a fifth aspect of the disclosure, in the first aspect, the hole injection layer may be divided into a plurality of parts isolated from each other in an island shape; the electron injection layer may be divided into a plurality of parts isolated from each other in an island shape; each of the plurality of parts isolated from each other in an island shape of the hole injection layer may form a first island group overlapping, when viewed in plan view, with a plurality of light emitting layers among the light emitting layers each formed having an island shape; each of the plurality of parts isolated from each other in an island shape of the electron injection layer may form a second island group overlapping, when viewed in plan view, with a plurality of light emitting layers among the light emitting layers each formed having an island shape; and one of the plurality of light emitting layers each formed having the island shape and overlapping with the first island group when viewed in plan view may be identical to one of the plurality of light emitting layers each formed having the island shape and overlapping with the second island group when viewed in plan view.

According to this configuration, a high-resolution EL display device that can suppress intense light emission at the end portion each of the light emitting layers while improving the light emitting efficiency inward from the end portion each of the light emitting layers can be achieved.

According to an EL display device of a sixth aspect of the disclosure, in the fifth aspect, the plurality of light emitting layers each formed having the island shape and overlapping with the first island group when viewed in plan view may be two adjacent light emitting layers; and the plurality of light emitting layers each formed having the island shape and overlapping with the second island group when viewed in plan view may be two adjacent light emitting layers.

According to this configuration, a high-resolution EL display device that can suppress intense light emission at the end portion each of the light emitting layers while improving the light emitting efficiency inward from the end portion each of the light emitting layers can be achieved.

According to an EL display device of a seventh aspect of the disclosure, in the fifth aspect, the plurality of light emitting layers each formed having the island shape and overlapping with the first island group when viewed in plan view may be three adjacent light emitting layers arranged in a L shape; and the plurality of light emitting layers each formed having the island shape and overlapping with the second island group when viewed in plan view may be three adjacent light emitting layers arranged in a L shape.

According to this configuration, a high-resolution EL display device that can suppress intense light emission at the end portion each of the light emitting layers while improving the light emitting efficiency inward from the end portion each of the light emitting layers can be achieved.

According to an EL display device of an eighth aspect of the disclosure, in any one of the first to seventh aspects, parts of the hole injection layer and the electron injection layer that overlap when viewed in plan view may overlap, when viewed in plan view, with an opening in an edge cover, the edge cover formed covering an end portion of whichever of the first electrode and the second electrode is in a lower layer.

According to this configuration, a high-resolution EL display device that can suppress intense light emission at the end portion each of the light emitting layers while improving the light emitting efficiency inward from the end portion each of the light emitting layers can be achieved.

According to an EL display device of a ninth aspect of the disclosure, in any one of the first to eighth aspects, the first electrode may be in a lower layer than the second electrode; and the first electrode may be a transparent electrode capable of transmitting light at wavelengths at which the light emitting layer emits the light, and the second electrode is a reflective electrode.

According to this configuration, a bottom emission-type EL display device that suppresses intense light emission at the end portion each of the light emitting layers while improving the light emitting efficiency inward from the end portion each of the light emitting layers can be achieved.

According to an EL display device of a tenth aspect of the disclosure, in any one of the first to eighth aspects, the first electrode may be in a higher layer than the second electrode; and the first electrode may be a transparent electrode capable of transmitting light at wavelengths at which the light emitting layer emits the light, and the second electrode may be a reflective electrode.

According to this configuration, a top emission-type EL display device that suppresses intense light emission at the end portion each of the light emitting layers while improving the light emitting efficiency inward from the end portion each of the light emitting layers can be achieved.

A method of manufacturing an EL display device according to an eleventh aspect of the disclosure is a method of manufacturing an EL display device including a first electrode, a second electrode opposing the first electrode, and light emitting layers each formed having an island shape, between the first electrode and the second electrode, the method including forming a hole injection layer between the first electrode and each of the light emitting layers, and forming an electron injection layer between the second electrode and each of the light emitting layers. The hole injection layer formed in the forming a hole injection layer and the electron injection layer formed in the forming an electron injection layer overlap only inward from an end portion each of the light emitting layers, when viewed in plan view.

According to the above-described method, the hole injection layer and the electron injection layer overlap only inward from the end portion each of the light emitting layers, and thus light is emitted only at the part inward from the end portion each of the light emitting layers. Accordingly, even in a case where the organic EL display device employs an edge cover having a sharp taper angle to increase the resolution, it is possible to achieve a method of manufacturing an organic EL display device that suppresses intense light emission at the end portion each of the light emitting layers and improves the light emitting efficiency at the part inward from the end portion each of the light emitting layers.

According to a method of manufacturing an EL display device of a twelfth aspect of the disclosure, in the eleventh aspect, in the forming a hole injection layer, the hole injection layer may be formed divided into a plurality of parts isolated from each other in an island shape using a first mask including a plurality of openings; and in the forming an electron injection layer, the electron injection layer may be formed covering the entireties of the light emitting layers using a second mask including a single opening.

According to this method, an EL display device that suppresses intense light emission at the end portion each of the light emitting layers while improving the light emitting efficiency inward from the end portion each of the light emitting layers can be achieved.

According to a method of manufacturing an EL display device of a thirteenth aspect of the disclosure, in the eleventh aspect, in the forming a hole injection layer, the hole injection layer may be formed covering the entireties of the light emitting layers using a second mask including a single opening; and in the forming an electron injection layer, the electron injection layer may be formed divided into a plurality of parts isolated from each other in an island shape using a first mask including a plurality of openings.

According to this method, an EL display device that suppresses intense light emission at the end portion each of the light emitting layers while improving the light emitting efficiency inward from the end portion each of the light emitting layers can be achieved.

According to a method of manufacturing an EL display device of a fourteenth aspect of the disclosure, in the eleventh aspect, in the forming a hole injection layer, the hole injection layer may be formed divided into a plurality of parts isolated from each other in an island shape using a first mask including a plurality of openings; and in the forming an electron injection layer, the electron injection layer may be formed divided into a plurality of parts isolated from each other in an island shape using a third mask including a plurality of openings.

According to this method, an EL display device that suppresses intense light emission at the end portion each of the light emitting layers while improving the light emitting efficiency inward from the end portion each of the light emitting layers can be achieved.

According to a method of manufacturing an EL display device of a fifteenth aspect of the disclosure, in the fourteenth aspect, the first mask used in the forming a hole injection layer may be identical to the third mask used in the forming an electron injection layer.

According to this method, an EL display device that suppresses intense light emission at the end portion each of the light emitting layers while improving the light emitting efficiency inward from the end portion each of the light emitting layers can be manufactured using a single mask in the forming a hole injection layer and the forming an electron injection layer.

According to a method of manufacturing an EL display device of a sixteenth aspect of the disclosure, in the eleventh aspect, in the forming a hole injection layer, the hole injection layer may be formed divided into a plurality of parts isolated from each other in an island shape using a fourth mask including a plurality of openings; in the forming an electron injection layer, the electron injection layer may be formed divided into a plurality of parts isolated from each other in an island shape using a fifth mask including a plurality of openings; and each of the plurality of openings in the fifth mask may partially overlap, when viewed in plan view, with two openings adjacent to each other in one direction of the plurality of openings in the fourth mask.

According to this method, a high-resolution EL display device that can suppress intense light emission at the end portion each of the light emitting layers while improving the light emitting efficiency inward from the end portion each of the light emitting layers can be achieved.

According to a method of manufacturing an EL display device of a seventeenth aspect of the disclosure, in the sixteenth aspect, the plurality of openings in the fourth mask and the plurality of openings in the fifth mask may be rectangular.

According to this method, a high-resolution EL display device that can suppress intense light emission at the end portion each of the light emitting layers while improving the light emitting efficiency inward from the end portion each of the light emitting layers can be achieved.

According to a method of manufacturing an EL display device of an eighteenth aspect of the disclosure, in the sixteenth aspect, the plurality of openings in the fourth mask and the plurality of openings in the fifth mask may be hook-shaped.

According to this method, a high-resolution EL display device that can suppress intense light emission at the end portion each of the light emitting layers while improving the light emitting efficiency inward from the end portion each of the light emitting layers can be achieved.

According to a method of manufacturing an EL display device of a nineteenth aspect of the disclosure, in the eleventh aspect, in the forming a hole injection layer, the hole injection layer may be formed divided into a plurality of parts isolated from each other in an island shape using a fourth mask including a plurality of openings; in the forming an electron injection layer, the electron injection layer may be formed divided into a plurality of parts isolated from each other in an island shape using the fourth mask moved in one direction; and each of the plurality of openings in the fourth mask that is moved may partially overlap, when viewed in plan view, with two openings adjacent to each other in one direction of the plurality of openings in the fourth mask before the fourth mask is moved.

According to this method, an EL display device that suppresses intense light emission at the end portion each of the light emitting layers while improving the light emitting efficiency inward from the end portion each of the light emitting layers can be manufactured using a single mask in the forming a hole injection layer and the forming an electron injection layer.

According to a method of manufacturing an EL display device of a twentieth aspect of the disclosure, in the nineteenth aspect, the plurality of openings in the fourth mask may be rectangular.

According to this method, a high-resolution EL display device that can suppress intense light emission at the end portion each of the light emitting layers while improving the light emitting efficiency inward from the end portion each of the light emitting layers can be achieved.

Additional Items

The disclosure is not limited to each of the embodiments stated above, and various modifications may be implemented within a range not departing from the scope of the claims. Embodiments obtained by appropriately combining technical approaches stated in each of the different embodiments also fall within the scope of the technology of the disclosure. Moreover, novel technical features may be formed by combining the technical approaches stated in each of the embodiments.

INDUSTRIAL APPLICABILITY

The disclosure can be applied in an EL display device, and in a method of manufacturing an EL display device.

REFERENCE SIGNS LIST

1 Organic EL display device (EL display device)
2 Hole injection layer
3 Coloring mask
4 Opening
5 Coloring mask
6R Opening
10 Organic EL display device (EL display device)
11 Electron injection layer
20 Organic EL display device (EL display device)
22 Hole injection layer
23 Electron injection layer
30 Organic EL display device (EL display device)
40 Coloring mask
41 Opening
50 Coloring mask
51 Opening
60 Coloring mask
61 Opening
70 Coloring mask
71 Opening
105 First electrode
106 Hole injection layer
107 Hole transport layer
108R Red light emitting layer
108G Green light emitting layer
108B Blue light emitting layer
109 Electron transport layer
110 Electron injection layer
111 Second electrode
112 Edge cover
112a Edge cover opening

The invention claimed is:

1. An EL display device comprising:
a first electrode;
a second electrode opposing the first electrode;
light emitting layers formed having island shapes, between the first electrode and the second electrode;
a hole injection layer provided between the first electrode and each of the light emitting layers; and
an electron injection layer provided between the second electrode and each of the light emitting layers,
wherein the hole injection layer and the electron injection layer overlap only at positions inward from an end portion of each of the light emitting layers, when viewed in a plan view,
the hole injection layer is divided into a plurality of parts isolated from each other in an island shape,
the electron injection layer is divided into a plurality of parts isolated from each other in an island shape,
each of the plurality of parts isolated from each other in the island shape of the hole injection layer forms a first island group overlapping, when viewed in the plan view, with at least some of the light emitting layers each formed having an island shape, and
each of the plurality of parts isolated from each other in the island shape of the electron injection layer forms a second island group overlapping, when viewed in the plan view, with the at least some of the light emitting layers formed having the island shape.

2. The EL display device according to claim 1,
wherein the plurality of light emitting layers each formed having the island shape and overlapping with the first island group when viewed in the plan view are two adjacent light emitting layers, and
the plurality of light emitting layers each formed having the island shape and overlapping with the second island group when viewed in the plan view are two adjacent light emitting layers.

3. The EL display device according to claim 1,
herein the plurality of light emitting layers each formed having the island shape and overlapping with the first island group when viewed in the plan view are three adjacent light emitting layers arranged in a L shape, and
the plurality of light emitting layers each formed having the island shape and overlapping with the second island group when viewed in the plan view are three adjacent light emitting layers arranged in a L shape.

4. The EL display device according to claim 1, wherein parts of the hole injection layer and the electron injection layer that overlap, when viewed in the plan view, with an opening in an edge cover, the edge cover formed covering an end portion of whichever of the first electrode and the second electrode is in a lower layer.

5. The EL display device according to claim 1, wherein the first electrode is in a lower layer than the second electrode, and
the first electrode is a transparent electrode capable of transmitting light at wavelengths at which the light emitting layer emits the light, and the second electrode is a reflective electrode.

6. The EL display device according to claim 1, wherein the first electrode is in a higher layer than the second electrode, and
the first electrode is a transparent electrode capable of transmitting light at wavelengths at which the light emitting layer emits the light, and the second electrode is a reflective electrode.

7. The EL display device according to claim 1, wherein the electron injection layer is formed covering the entireties of the light emitting layers, and
each of the plurality of parts isolated from each other in the island shape of the hole injection layer is smaller than each of the light emitting layers.

8. The EL display device according to claim 1, wherein the hole injection layer is formed overlapping with the entireties of the light emitting layers when viewed in the plan view, and
each of the plurality of parts isolated from each other in the island shape of the electron injection layer is smaller than each of the light emitting layers.

9. The EL display device according to claim 1, wherein
each of the plurality of parts isolated from each other in the island shape of the hole injection layer overlaps with each of the plurality of parts isolated from each other in the island shape of the electron injection layer when viewed in the plan view, and
each of the plurality of parts isolated from each other in the island shape of the hole injection layer and the plurality of parts isolated from each other in the island shape of the electron injection layer that overlap when viewed in the plan view are each smaller than each of the light emitting layers.

10. A method of manufacturing an EL display device, the EL display device including a first electrode, a second electrode opposing the first electrode, and light emitting layers each formed having an island shape, between the first electrode and the second electrode, the method comprising:
forming a hole injection layer between the first electrode and each of the light emitting layers; and
forming an electron injection layer between the second electrode and each of the light emitting layers,
wherein the hole injection layer formed in the forming the hole injection layer and the electron injection layer formed in the forming the electron injection layer overlap only at portions inward from an end portion of each of the light emitting layers, when viewed in the plan view,
in the forming the hole injection layer, the hole injection layer is formed divided into a plurality of parts isolated from each other in an island shape using a fourth mask including a plurality of openings,
in the forming the electron injection layer, the electron injection layer is formed divided into a plurality of parts isolated from each other in an island shape using a fifth mask including a plurality of openings, and
each of the plurality of openings in the fifth mask partially overlaps, when viewed in the plan view, with two openings adjacent to each other in one direction of the plurality of openings in the fourth mask.

11. The method of manufacturing an EL display device according to claim 10, wherein the plurality of openings in the fourth mask and the plurality of openings in the fifth mask are rectangular.

12. The method of manufacturing an EL display device according to claim 10, wherein the plurality of openings in the fourth mask and the plurality of openings in the fifth mask are hook-shaped.

13. The method of manufacturing an EL display device according to claim 10, wherein the hole injection layer is formed using a first mask including a plurality of openings, and
the electron injection layer is formed covering entireties of the light emitting layers using a second mask including a single opening.

14. The method of manufacturing an EL display device according to claim 10, wherein the hole injection layer is formed covering entireties of the light emitting layers using a second mask including a single opening, and
the electron injection layer is formed divided into a plurality of parts isolated from each other in an island shape using a first mask including a plurality of openings.

15. The method of manufacturing an EL display device according to claim 10, wherein the hole injection layer is formed using a first mask including a plurality of openings, and
the electron injection layer is formed using a third mask including a plurality of openings.

16. The method of manufacturing an EL display device according to claim 15, wherein the first mask used in the forming of the hole injection layer is identical to the third mask used in the forming of the electron injection layer.

17. A method of manufacturing an EL display device, the EL display device including a first electrode, a second electrode opposing the first electrode, and light emitting layers each formed having an island shape, between the first electrode and the second electrode, the method comprising:
forming a hole injection layer between the first electrode and each of the light emitting layers; and
forming an electron injection layer between the second electrode and each of the light emitting layers,
wherein the hole injection layer formed in the forming the hole injection layer and the electron injection layer formed in the forming the electron injection layer overlap only at portions inward from an end portion of each of the light emitting layers, when viewed in the plan view,
in the forming the hole injection layer, the hole injection layer is formed divided into a plurality of parts isolated from each other in an island shape using a fourth mask including a plurality of openings, in the forming the electron injection layer, the electron injection layer is formed divided into a plurality of parts isolated from each other in an island shape using the fourth mask moved in one direction, and each of the plurality of openings in the fourth mask that is moved partially overlaps, when viewed in the plan view, with two openings adjacent to each other in one direction of the plurality of openings in the fourth mask before the fourth mask is moved.

18. The method of manufacturing an EL display device according to claim 17, wherein the plurality of openings in the fourth mask are rectangular.

* * * * *